US009054740B1

(12) United States Patent
Li et al.

(10) Patent No.: US 9,054,740 B1
(45) Date of Patent: *Jun. 9, 2015

(54) LOW DENSITY PARITY CHECK DECODING WITH EARLY TERMINATION BASED ON NONZERO-CIRCULANT FLAGS

(71) Applicant: Marvell International Ltd., Hamilton (BM)

(72) Inventors: Shu Li, Sunnyvale, CA (US); Panu Chaichanavong, Bangkok (TH); Naim Siemsen-Schumann, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/188,068

(22) Filed: Feb. 24, 2014

Related U.S. Application Data

(63) Continuation of application No. 13/197,353, filed on Aug. 3, 2011, now Pat. No. 8,661,326.

(60) Provisional application No. 61/370,651, filed on Aug. 4, 2010.

(51) Int. Cl.
*G06F 11/00* (2006.01)
*H03M 13/00* (2006.01)
*H03M 13/11* (2006.01)
*H03M 13/29* (2006.01)

(52) U.S. Cl.
CPC ...... *H03M 13/1128* (2013.01); *H03M 13/2948* (2013.01); *H03M 13/2975* (2013.01)

(58) Field of Classification Search
CPC ............... H03M 13/1128; H03M 13/2948; H03M 13/2975
USPC ................... 714/758, 786, 800–801
See application file for complete search history.

(56) References Cited

U.S. PATENT DOCUMENTS

| 6,526,531 | B1 | 2/2003 | Wang |
| 8,010,869 | B2 | 8/2011 | Wehn et al. |
| 8,140,930 | B1 | 3/2012 | Maru |
| 8,291,283 | B1 | 10/2012 | Rad et al. |
| 2005/0015696 | A1 | 1/2005 | Bune |
| 2005/0022101 | A1 | 1/2005 | Malm et al. |

OTHER PUBLICATIONS

Stoye, LDPC iteration control by partial parity check, 2009, IEEE, p. 602-605.*

* cited by examiner

*Primary Examiner* — Shelly A Chase

(57) ABSTRACT

A method includes receiving a codeword over a communications channel and initializing a test codeword to be equal to the codeword received over the communications channel. The method includes performing, for each row of a low-density parity check (LDPC) matrix, an LDPC processing operation on the test codeword. The method includes, once the LDPC processing operations have been performed for all of the rows of the LDPC matrix, repeating the LDPC processing operations. The method includes monitoring progress of the LDPC processing operations. The method includes selectively generating a termination signal in response to the test codeword being a valid codeword according to the LDPC matrix. The method includes terminating the LDPC processing operations in response to generation of the termination signal.

16 Claims, 17 Drawing Sheets

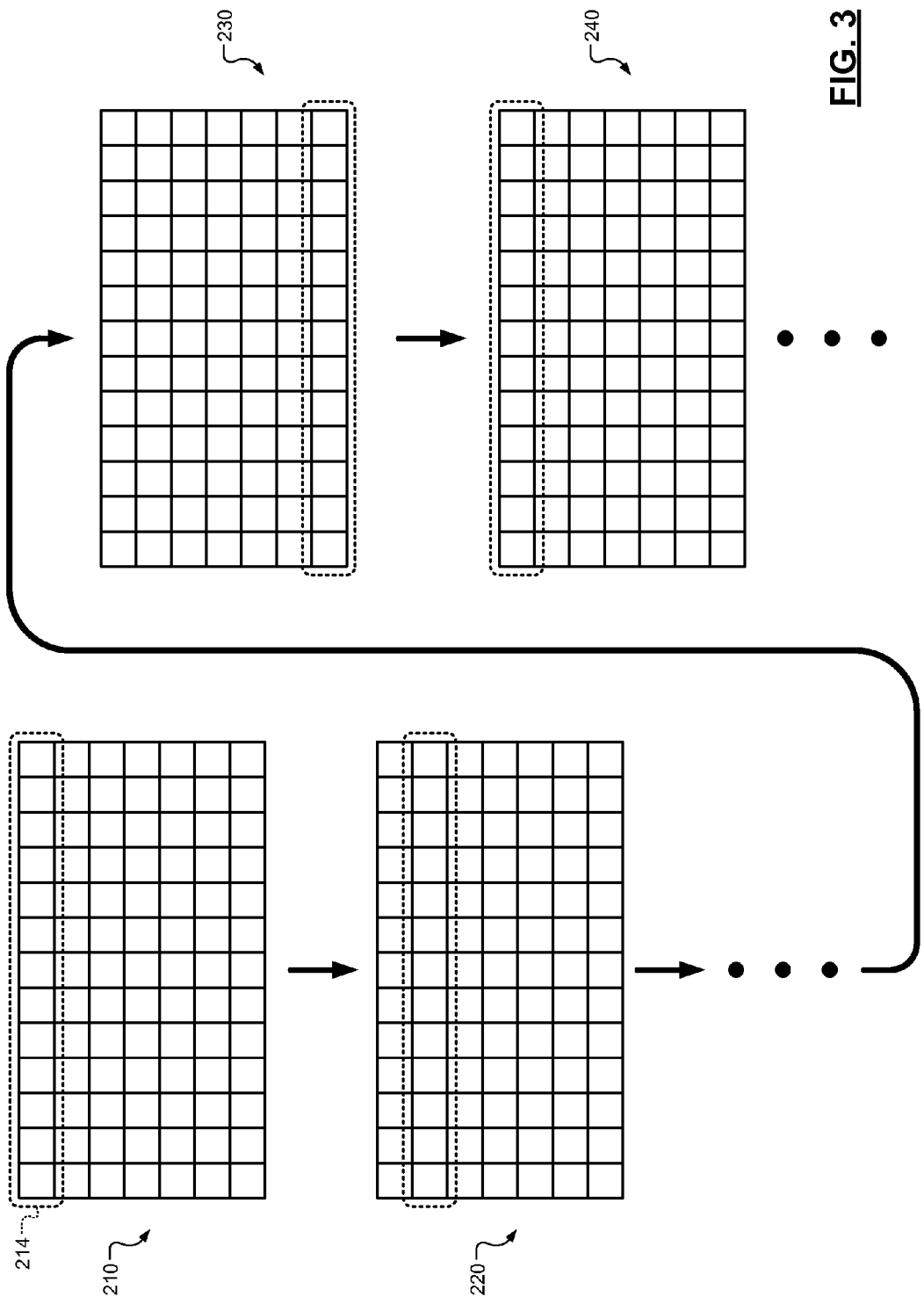

LOW DENSITY PARITY CHECK DECODING WITH EARLY TERMINATION BASED ON NONZERO-CIRCULANT FLAGS

CROSS-REFERENCE TO RELATED APPLICATIONS

This is a continuation of U.S. patent application Ser. No. 13/197,353, filed on Aug. 3, 2011, which claims the benefit of U.S. Provisional Application No. 61/370,651, filed Aug. 4, 2010. The entire disclosures of the applications referenced above are incorporated herein by reference.

FIELD

The present disclosure relates to low density parity code (LDPC) decoding and more particularly to early termination of non-binary LDPC code decoding.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

When data is sent across a communications channel, noise and other distortions of the channel may alter the data by the time the data is received. Various error detection and error correction mechanisms are used to detect and possibly correct such errors. One class of error correcting codes (ECC) is linear block ECCs, which include low-density parity check (LDPC) codes.

When using an LDPC code, user data is divided into blocks of K bits or symbols. Each of the blocks is mapped, or encoded, into a codeword having N bits or symbols, where N is greater than K. The difference between N and K represents redundancy. More redundancy allows for detection of errors even when more errors are present, and allows for more errors to be corrected. LDPC codes may be characterized by a rate calculated by dividing K by N.

FIG. 1 illustrates a graphical illustration of a simple ECC scheme. In FIG. 1, K is equal to four and N is equal to seven. A column 100 shows the 16 ($2^4$) possible combinations of user message bits. Column 104 shows 16 corresponding codewords. In this example, each codeword is created by prepending three parity bits to the user message bits. This encoding is performed at a transmitter, and the encoding is known a priori by the receiver.

For purposes of illustration only, one of the codewords (1101000) is transmitted across a channel 108. For example only, the resulting received data is 1111000. In this particular example, the third bit has been corrupted by the channel 108, switching from a zero to a one. This seven-bit data is part of a seven-bit word space 112, which represents all possible combinations of seven bits ($2^7$=128). However, only 16 of those seven-bit combinations are valid codewords.

A decoding process therefore determines which codeword of a seven-bit codeword space 116 corresponds to the received data. At various times, the received data may already be within the seven-bit codeword space 116. This can happen when a codeword is received uncorrupted by the channel 108. However, this may also occur if multiple bits of the codeword are corrupted by the channel 108, but the result is another valid codeword. In such a situation, the ECC may not detect an error. For this reason, as described in more detail below, a secondary error detection strategy, such as a cyclic redundancy check (CRC), may be used across multiple blocks of user data. Error detection mechanisms, such as CRC, are designed such that even multiple bit corruptions will still be detected. The trade off is that such CRC mechanisms may not be able to correct those errors. However, when an uncorrectable error is detected, the original data may be able to be retransmitted.

Once a valid seven-bit codeword is selected based on the received data, corresponding user bits from a four-bit message space 120 are determined by a decoding process. In the example of FIG. 1, a seven-bit codeword can be converted into a four-bit message simply by ignoring the left three bits of the seven-bit codeword.

In practice, ECC encoding may not simply prepend or append parity bits to user data to generate codewords. For example, such as in LDPC coding, a vector of user data may be multiplied by a generator matrix in order to arrive at a codeword. This may be represented as $v = u \cdot G$, where u is user data to be encoded, G is the generator matrix, and v is the resulting codeword. Because the user data u is a block of K bits or symbols, and the resulting codeword v contains N bits or symbols, the generator matrix has K rows and N columns:

$$G = \begin{bmatrix} g_{00} & g_{01} & \cdots & g_{0,n-1} \\ g_{10} & g_{11} & \cdots & g_{1,n-1} \\ \cdots & \cdots & \cdots & \cdots \\ g_{k-1,0} & g_{k-1,1} & \cdots & g_{k-1,n-1} \end{bmatrix}$$

A parity check matrix H is associated with a generator matrix G, and has the property that if the resulting codeword v was created by the generator matrix G, then the product of resulting codeword v and the transpose of the parity check matrix H is zero: $v \cdot H^T = 0$. However, if a corrupted codeword is multiplied by the transpose of the parity check matrix H, a non-zero vector, called a syndrome, results: $\hat{v} \cdot H^T = S$. The LDPC decoding process attempts to find a codeword v' based on the corrupted codeword that will cause the syndrome to go to zero, thereby indicating that the codeword v' is a valid codeword. The codeword v' may also be referred to as a hard decision, which may change throughout the course of LDPC decoding.

In a binary LDPC code, the user data and the codeword are expressed as binary bits. In non-binary LDPC encoding, the user message and the codewords are formed of non-binary symbols. For example only, the symbols may be chosen from a Galois Field (GF). For example, the symbols may be chosen from a GF-4 space. When user data is binary, the binary user data is first mapped into the GF-4 space. Similarly, decoded codewords are mapped from the GF-4 space back into the binary space. The elements of GF-4 may be called 0, 1, A, and B or, as below, 0, 1, 2, and 3. For reference only, addition and multiplication tables for GF-4 are presented here.

| Add | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

| Multiply | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

An example generator matrix for creating a seven-symbol codeword from a four-symbol data vector is shown for purposes of illustration only:

$$G = \begin{bmatrix} 3 & 1 & 0 & 2 & 0 & 0 & 0 \\ 0 & 1 & 1 & 0 & 2 & 0 & 0 \\ 1 & 1 & 1 & 0 & 0 & 2 & 0 \\ 1 & 0 & 1 & 0 & 0 & 0 & 2 \end{bmatrix},$$

and the corresponding parity check matrix is:

$$H = \begin{bmatrix} 2 & 0 & 0 & 3 & 0 & 1 & 1 \\ 0 & 2 & 0 & 1 & 1 & 1 & 0 \\ 0 & 0 & 2 & 0 & 1 & 1 & 1 \end{bmatrix}.$$

For an example four-symbol data vector, the codeword is calculated by multiplying the user data vector by the generator matrix. The resulting codeword v is checked by observing that multiplication of codeword by the transpose of the parity check matrix H is equal to zero:

$u$=(1 3 0 2)

$v$=$u·G$=(1 2 1 2 1 0 3)

$v·H^T$=0

By contrast, if a corrupted codeword is received, such as when the last symbol of the codeword is received as a one instead of a three, the resulting multiplication by the transpose of the parity check matrix H is non-zero:

$\hat{v}$=(1 2 1 3 1 0 1)

$\hat{v}·H^T$=(1 1 2)

Therefore, LDPC decoding attempts to find a codeword v corresponding to v' that will cause the parity check multiplication to equal zero.

SUMMARY

A decoding system includes a low density parity check (LDPC) processing module and a termination module. The LDPC processing module is configured to receive a test codeword based on a codeword received over a communications channel, and perform, for each row of a parity check matrix, a processing operation on the test codeword. The LDPC processing module is configured to, once the processing operations have been performed for all the rows, repeat the processing operations. The termination module is configured to monitor progress of the LDPC processing module and selectively generate a termination signal in response to the test codeword being a valid codeword according to the parity check matrix. The LDPC processing module is further configured to terminate the processing operations in response to generation of the termination signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 3 is a graphical depiction of a decoding process;

DESCRIPTION

Figure 1:
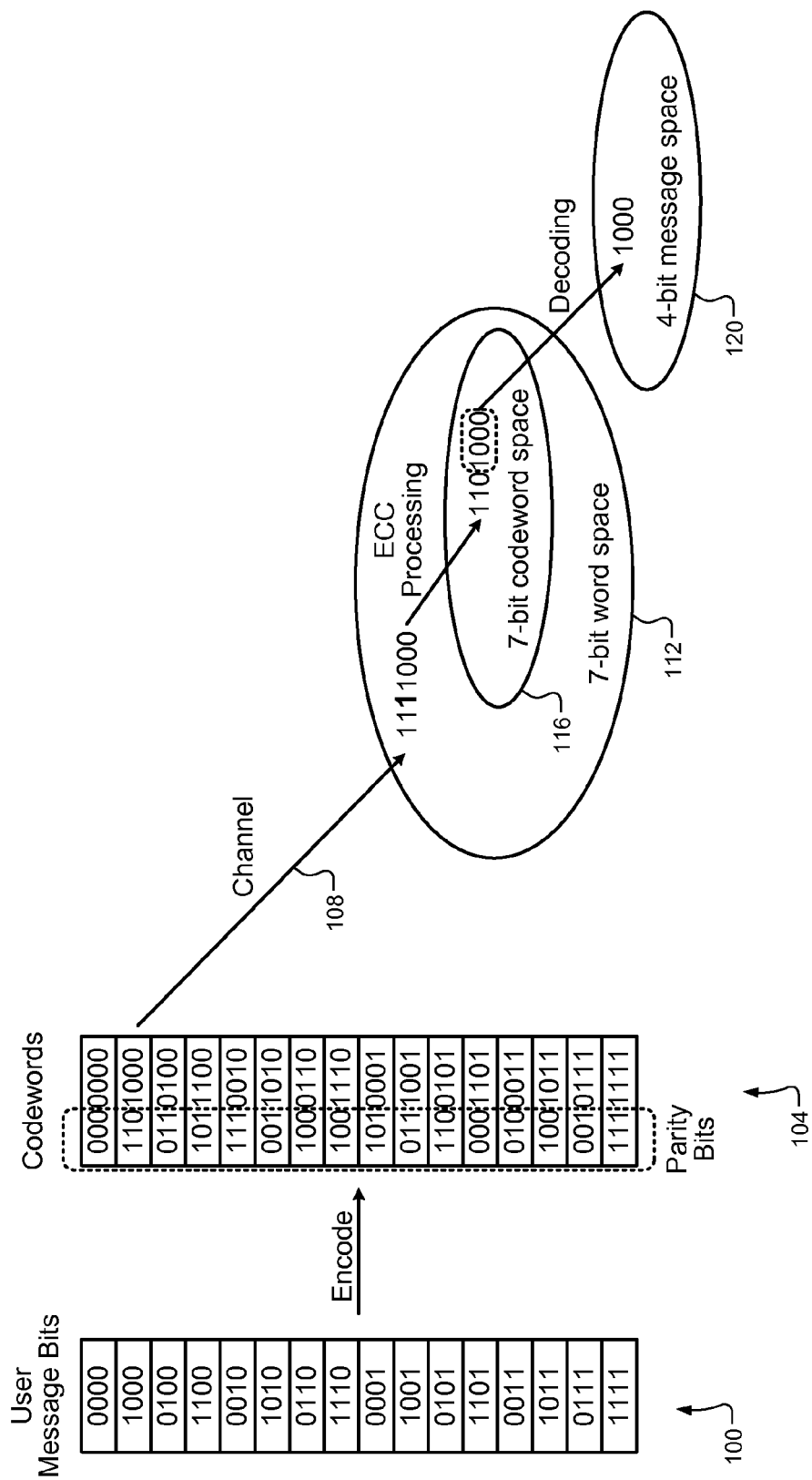
FIG. 1 is a graphical illustration of a simple ECC scheme.
Figure 2B:
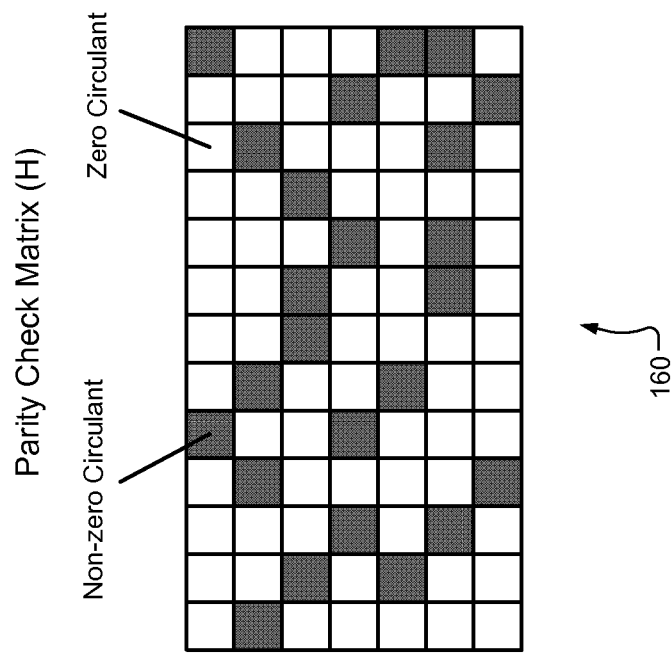
FIGS. 2A-2B are visual representations of a parity check matrix.
Figure 2A:
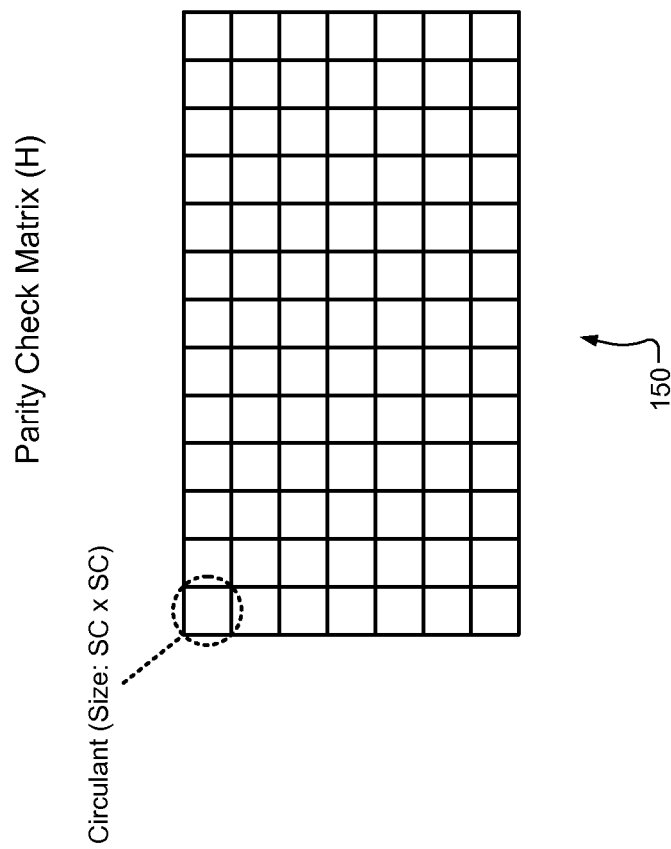

Referring now to FIG. 2A, a visual representation of a parity check matrix (H) 150 is shown. The parity check matrix (H) in this example is formed by a 7 by 13 grid of circulants. Each circulant is a sub-matrix of the parity check matrix (H) and is a square matrix, where both dimensions of the sub-matrix are size SC.

A circulant matrix means that each row of the circulant is shifted right by one location with respect to the above row in the circulant. This shifting wraps from one side to another such that the right-most value of one row becomes the left-most value of the row below. Because of the definition of a circulant, a circulant can be fully specified by its first row, called the generator row. Each subsequent row is simply a shift of the above row. In various implementations, each of the circulants in the parity check matrix (H) has at most one non-zero element in each row.

Referring now to FIG. 2B, an example parity check matrix 160 (H) is shown. The parity check matrix 160 may be used for low density parity check (LDPC) encoding, and is therefore sparse, which means that many elements of the parity check matrix 160 are zero. Each of the circulants of the parity check matrix 160 that include a non-zero value are shown shaded. The remaining circulants of the parity check matrix 160 are all zeros. Even the non-zero circulants may have few non-zero members. For example, as described above, the generator row of each of the non-zero circulants may include only a single non-zero value. The LDPC codes according to the principles of the present disclosure may be binary or non-binary. For purposes of illustration, the description below will refer to the LDPC codes as being non-binary.

Referring now to FIG. 3, a graphical depiction of a decoding process is shown. The depicted process is called layer decoding, in which each row of circulants of the parity check matrix is used in sequence to process the received codeword. In the description below, a row of circulants of the parity check matrix will simply be referred to as a row of the parity check matrix and, similarly, a column of circulants of the parity check matrix will be referred to simply as a column of the parity check matrix.

At 210, the codeword is decoded with respect to the first row of the parity check matrix, also known as the first layer 214. A test codeword, based on the received codeword, may be updated based on the first layer 214. The updated test codeword is then multiplied by the first layer 214 to check whether the result is 0. This may be referred to as a row check. When the result is 0, the test codeword satisfies the first layer, and the row check is determined to have been passed. When the result is non-zero, the test codeword cannot be a valid codeword and the row check is determined to have been failed.

Then, at 220, the codeword is decoded with respect to the second row of the parity check matrix, also referred to as the second layer. Decoding proceeds with the third, fourth, fifth, and sixth rows of the parity check matrix and at 230, control decodes the codeword with respect to the seventh row of the parity check matrix. At 240, control begins another iteration of the decoding, starting again with the first row of the parity check matrix. In various implementations, rows of the parity check matrix may be processed in different orders, and the order may change from iteration to iteration.

Figure 4:
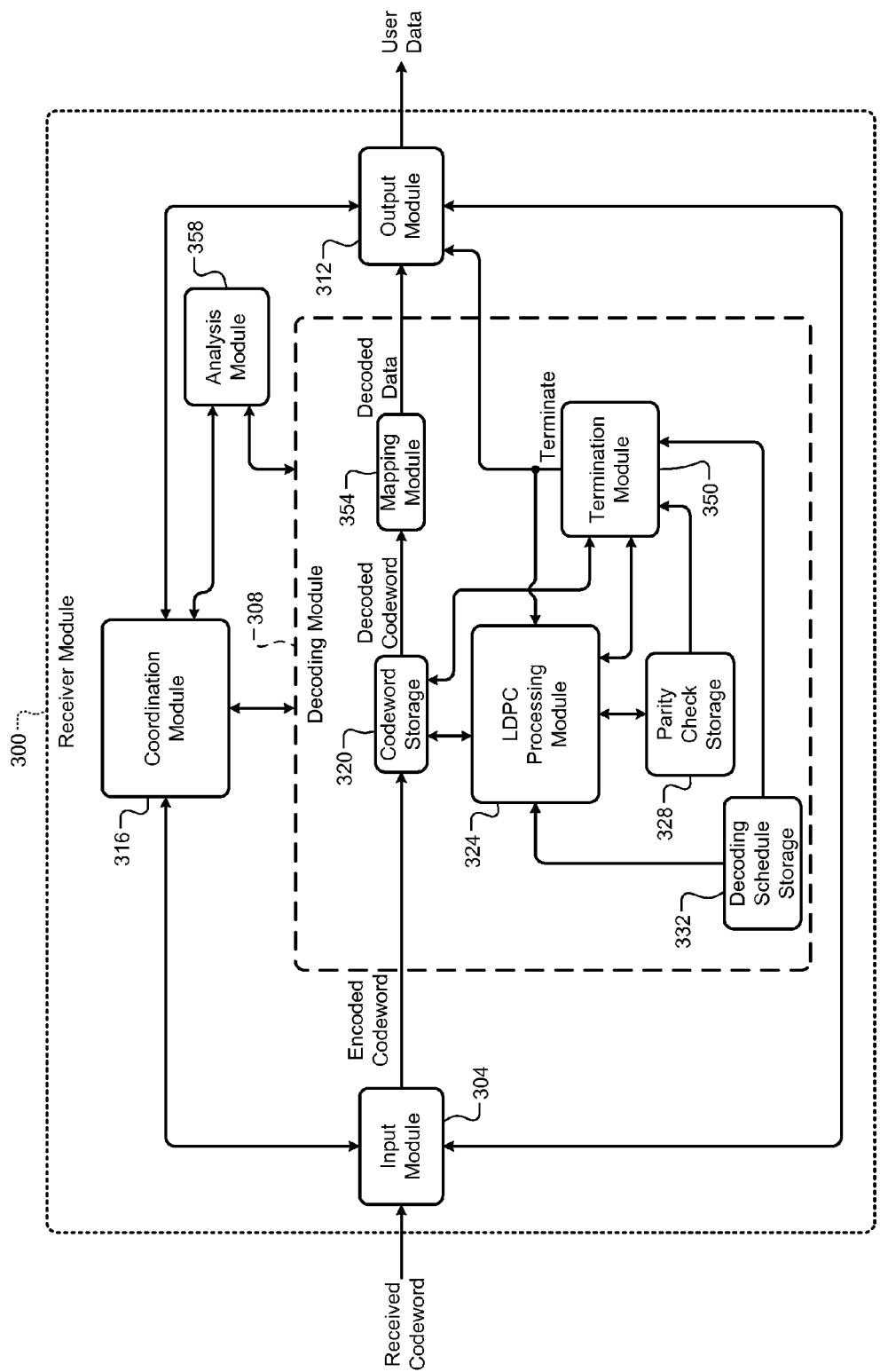
FIG. 4 is a functional block diagram of an example implementation of a receiver module.

Referring now to FIG. 4, a functional block diagram of an example receiver module 300 according to the principles of the present disclosure is presented. The receiver module 300 includes an input module 304 that receives a codeword over a communications channel. The communications channel may be wired or wireless, and may include storage devices, in which codewords are stored and later retrieved. For example only, a hard disk drive platter and read/write circuitry may be considered to be a communications channel.

The input module 304 provides an encoded codeword based on the received codeword to a decoding module 308. The decoding module 308 outputs decoded data to an output module 312. The output module 312 selectively outputs user data from the receiver module 300. A coordination module 316 may coordinate operation of the input module 304, the decoding module 308, and the output module 312.

For example only, the coordination module 316 may instruct the input module 304 to provide the encoded codeword to the decoding module 308. The coordination module 316 may receive decoded data from the output module 312 and provide that decoded data back to the decoding module 308 via the input module 304 for additional decoding by the decoding module 308.

For example only, the coordination module 316 may process an error checking code, such as a cyclic redundancy check (CRC). If the CRC check fails, the coordination module 316 may provide certain data back to the decoding module 308 for further decoding. Additionally or alternatively, the coordination module 316 may adjust the data provided to the decoding module 308 and evaluate the resulting decoded data to see if the CRC has become valid. The decoding module 308 includes a codeword storage module 320, which receives the encoded codeword.

An LDPC processing module 324 decodes the codeword stored in the codeword storage module 320 based on a parity check matrix stored in a parity check storage module 328. The LDPC processing module 324 may operate based on instructions and scheduling parameters from a decoding schedule storage module 332. The LDPC processing module 324 may be configured to decode the codeword over a predetermined number of iterations.

This number of iterations may be determined on a worst-case scenario, such as a lowest-acceptable signal-to-noise ratio (SNR). Each decoding iteration may proceed with decoding of each layer of the parity check matrix, as shown in FIG. 3. In various cases, the encoded codeword may require less processing, such as when the SNR is relatively high. A termination module 350 therefore monitors progress of the LDPC processing module 324 and can terminate LDPC processing prior to completion of the predetermined number of iterations.

The termination module 350 may use information about the parity check matrix from the parity check storage module 328. In addition, information about the parity check matrix, such as spacing between non-zero circulants of the parity check matrix, may be stored in the decoding schedule storage module 332. The termination module 350 may monitor the codeword storage module 320 to determine when the stored codeword has changed. In addition, the termination module 350 communicates with the LDPC processing module 324 to determine when each layer of processing in performed. Further, the termination module 350 may receive information from the LDPC processing module 324 about whether the present codeword satisfies the parity check matrix.

By reducing the number of iterations performed, processing time, and therefore throughput, may be improved. Further, for a given throughput, power consumption may be reduced. In addition, by increasing throughput, input buffering can be reduced, thereby saving area. In addition, information about when processing terminated can be used for statistics and optimization. For example, consistently terminating after a fewer number of iterations indicates that SNR has improved for the communications channel.

When the termination module 350 generates a terminate signal, processing by the LDPC processing module 324 may be halted. In addition, a mapping module 354 translates the decoded codeword stored in the codeword storage module 320 into decoded data. For example, the mapping module 354 may convert the codeword into user data and may map the user data from non-binary symbols, such as GF-4 symbols, into binary data. The output module 312 may recognize the decoded data from the mapping module 354 as valid when the terminate signal is received from the termination module 350.

An analysis module 358 monitors information about the decoding module 308 such as the number of iterations performed before processing is terminated. In addition, the analysis module 358 may track the number of global iterations requested by the coordination module 316. This information can be used for optimization and troubleshooting purposes. Further, the analysis module 358 may maintain a historical record that may indicate long-term changes, such as in reliability of the communications channel.

Figure 5B:
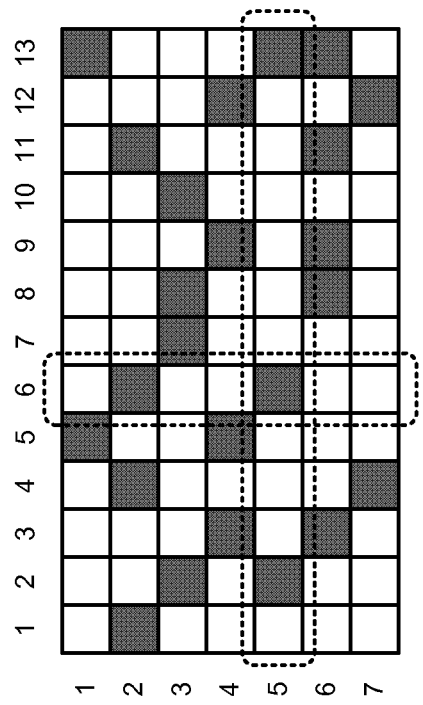
FIGS. 5A-5B are graphical illustrations of processing based on the parity check matrix of FIG. 2B.
Figure 5A:
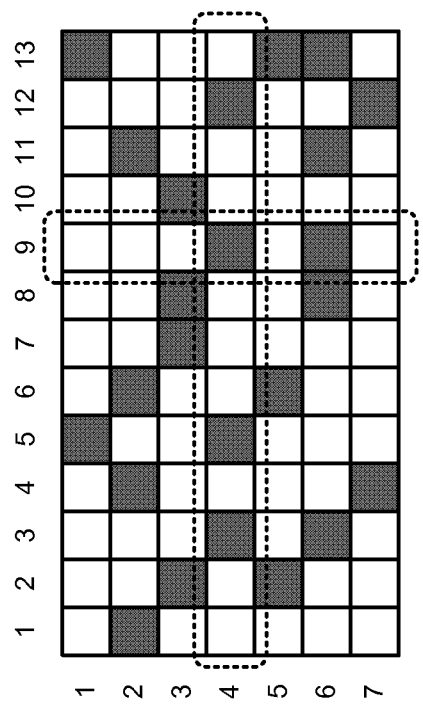

Referring now FIG. 5A, a graphical illustration of processing based on the parity check matrix of FIG. 2B is presented. As discussed above, the size of the codeword and the size of the parity check matrix are related, in that the width of the parity check matrix is the same as the length of the codeword. In FIG. 5A, the parity check matrix has 13 columns, each column representing a circulant, whose width is SC. The width of the parity check matrix is therefore 13*SC. Accordingly, the codeword is composed of 13*SC symbols.

In order for a codeword to be considered valid, the product of the codeword and the transpose of the parity check matrix must be zero. Properties of matrix multiplication mean that the product of the codeword with each row of the parity check matrix must each be zero. When this is true, the product of the codeword and the entire parity check matrix will be a zero vector. In other words, when each of the row checks for a certain codeword have passed, the codeword is a valid codeword.

In FIG. 5A, there are seven rows and therefore, if the codeword satisfies the parity check for each of the rows one through seven, the codeword is determined to be valid and processing can be terminated. This is referred to as direct termination. If the codeword is changed by LDPC processing, the row checks must be performed again for the changed codeword. For example, if during processing at the fourth layer, the ninth section of the codeword is changed, previously passed row checks are not necessarily valid. Direct termination may therefore wait for row checks for rows one to seven to be passed for the new codeword before terminating LDPC processing.

Direct termination may be refined. For example, when the codeword is changed at row four, previous row checks may not be valid. Therefore, the new codeword must be tested against the other rows—five through seven and one through three. However, once the codeword is tested against rows five through seven and one through three, processing can be terminated. It is not necessary that the row checks begin in row one and end in row seven.

Direct termination ignores the fact that some codeword changes do not affect some of the previous row checks. For a given row, the only sections of the codeword that are relevant to a row check are the sections corresponding to the non-zero circulants of the row. This is because a zero circulant will result in a zero output regardless of the corresponding values of the codeword. For this reason changing a certain section of the codeword will only affect the partial checks performed by certain rows.

For example only, with respect to row four, the product of the codeword and fourth row of the parity check matrix must be zero for the codeword to be valid. Because zero circulants, when multiplied by any values, even non-zero, will result in zero, the first, second, fourth, sixth, seventh, eighth, tenth, eleventh, and thirteenth sections of the codeword are irrelevant for the fourth row of the parity check matrix. In other words, if a codeword satisfies the fourth row of the parity check matrix (the product is zero), changes to the first or second sections of the codeword will not affect the codeword's validity with respect to the fourth row. Assume that, as shown in FIG. 5B, the sixth section of the codeword is changed when processing the fifth row of the parity check matrix. In such a case, the fourth row check will not need to be repeated, as the changed section of the codeword is irrelevant to the fourth row of the parity check matrix.

Stated another way, a change to the ninth section of the codeword will only affect the row checks performed by rows four and six. Therefore, if a change is made to the ninth section of the codeword, checking rows four and six is sufficient to determine that the change does not result in the test codeword being invalid. For example, assume that the row checks for rows five, six, seven, one, two, and three have all been passed for a given codeword. However, during the processing of row four, the ninth section of the codeword has changed. This change to the ninth section of the codeword does not affect the validity of the tests for rows one, two, three, five, and seven. Instead, only row six will need to be checked to ensure that the change to the ninth section of the codeword has resulted in a valid codeword. When the rows are processed in order, this means that row five will also be processed on the way to processing row six.

Similarly, if checks for rows four and five have passed when processing at row six causes the ninth section of the codeword to be changed, the check performed by row four is no longer valid and must be repeated. When the rows are processed in order, row checks are then performed on rows seven and rows one through five. If each of these row checks passes, the codeword is a valid codeword.

A count, N, may be maintained of the number of valid row tests that have been performed on the current codeword. When N reaches the number of rows (7 in the cases described with respect to FIGS. 5A and 5B), the codeword is determined to be a valid codeword. For example only, assume that rows one through five have all tested the codeword and found the codeword valid. Based on processing at row six, the ninth section of the codeword is changed. The gap along column nine between the row that has changed (six) and the most recent row having a non-zero circulant (four) is two. Therefore, N must be reset to two because only the last two checks are valid. In other words, the checks for rows for five and six are valid, but the checks for the previous rows are not.

If during the processing of row six, the thirteenth section of the codeword were changed, the column gap between present row (6) and the most recent row having a non-zero circulant in that column (5) is one. Therefore, instead of resetting N to two, N would need to be reset to one. This indicates that only one row check, the row check for row six, is valid. In other words, for columns in which the codeword has changed, the minimum gap between the present row and the previous non-zero circulant determines the point to which N must be reduced. If the current codeword does not satisfy the row test, N is set to zero. This column-gap approach is further described in FIG. 7.

In certain instances, the column gap may appear negative, such as when section nine of the codeword is changed at row four. In this case, the column gap is four minus six, or negative two. This negative number can be added to the number of rows to arrive at five. Five is the correct number to reduce N to because the row checks for rows seven and one through four are still valid (assuming that the row check for row four passes).

An alternative implementation, where a set of flags is stored, one for each column of the parity check matrix, is described below with respect to FIG. 8. Each flag of the set of flags corresponds to one of the columns of the parity check matrix. When a row check has been passed, the flags corresponding to the non-zero circulants of the row are set to one. These flags indicate which changes to the codeword will necessitate re-evaluation of previous row checks.

Figure 6A:
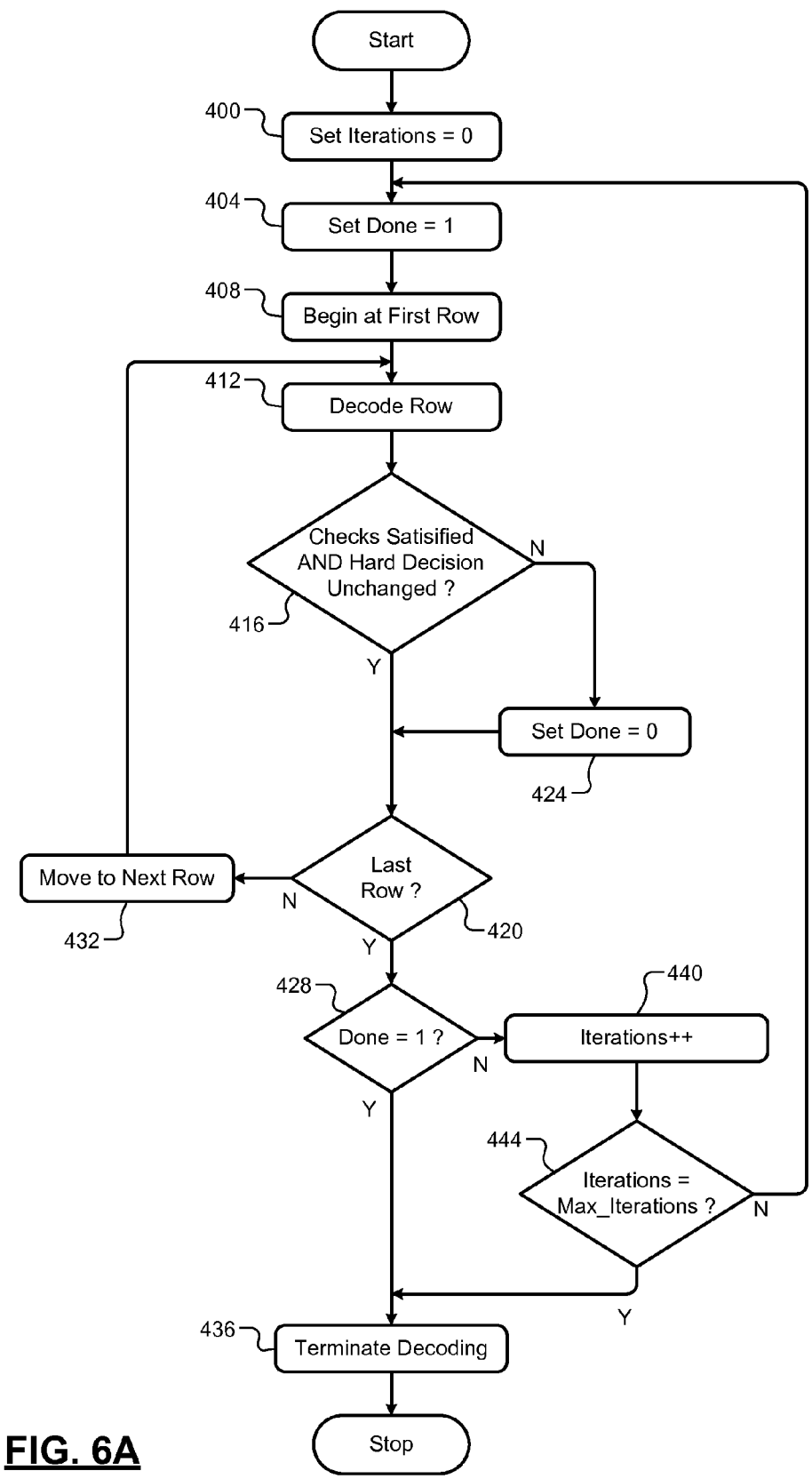
FIGS. 6A-6B are flowcharts depicting examples of operation of direct termination.

Referring now to FIG. 6A, a flowchart depicts example operation of direct termination. Control starts at 400, where an iterations variable is set to zero. This iterations variable tracks the number of local iterations performed by an LDPC processing module. Global iterations may be controlled by a coordination module, with the control of FIG. 6A starting each time the coordination module requests LDPC processing.

Control continues from 400 to 404, where a done variable is initialized to one. At 408, control begins at the first row of the parity check matrix. Control continues at 412, where the layer corresponding to the current row is processed. This processing may change the codeword, also referred to as changing the hard decision. Control continues at 416, where control determines whether the current row check has been satisfied and the hard decision is unchanged. If both of these conditions are true, control transfers to 420; otherwise control transfers to 424. In the present disclosure, the concepts of the row check having passed and the row check having been satisfied are used interchangeably.

At 424, control sets a "done flag" to 0 and continues at 420. The done flag is set to 0 because either the hard decision has changed or the current rows checks are not satisfied. As a result, another iteration through the parity check matrix will be performed, and the done flag records this determination. At 420, control determines whether the last row has been processed. If so, control transfers to 428; otherwise, control transfers to 432. At 432, control moves to the next row and continues at 412.

At 428, control checks when the done flag has remained at one. If so, control transfers to 436; otherwise, control transfers to 440. At 436, the done flag remained at one for all of the rows and therefore the codeword has converged to a valid codeword. Control terminates decoding and stops. As described above, control may be restarted by the coordination module, such as when a new codeword is received or when the previously outputted codeword is to be reprocessed.

At 440, the iterations variable is incremented by one and control continues at 444. At 444, control checks whether the iterations variable is equal to a predetermined maximum number of iterations. If so, control transfers to 436; otherwise, control returns to 404 to perform another local iteration. The number of maximum iterations may be empirically determined through measurement or simulation based on the number of iterations required for a codeword to converge at a specified probability for a specified signal to noise ratio. In other words, when the maximum number of iterations are performed, codewords received over a channel having the specified signal to noise ratio converge to a valid codeword with at least the specified probability.

Figure 6B:
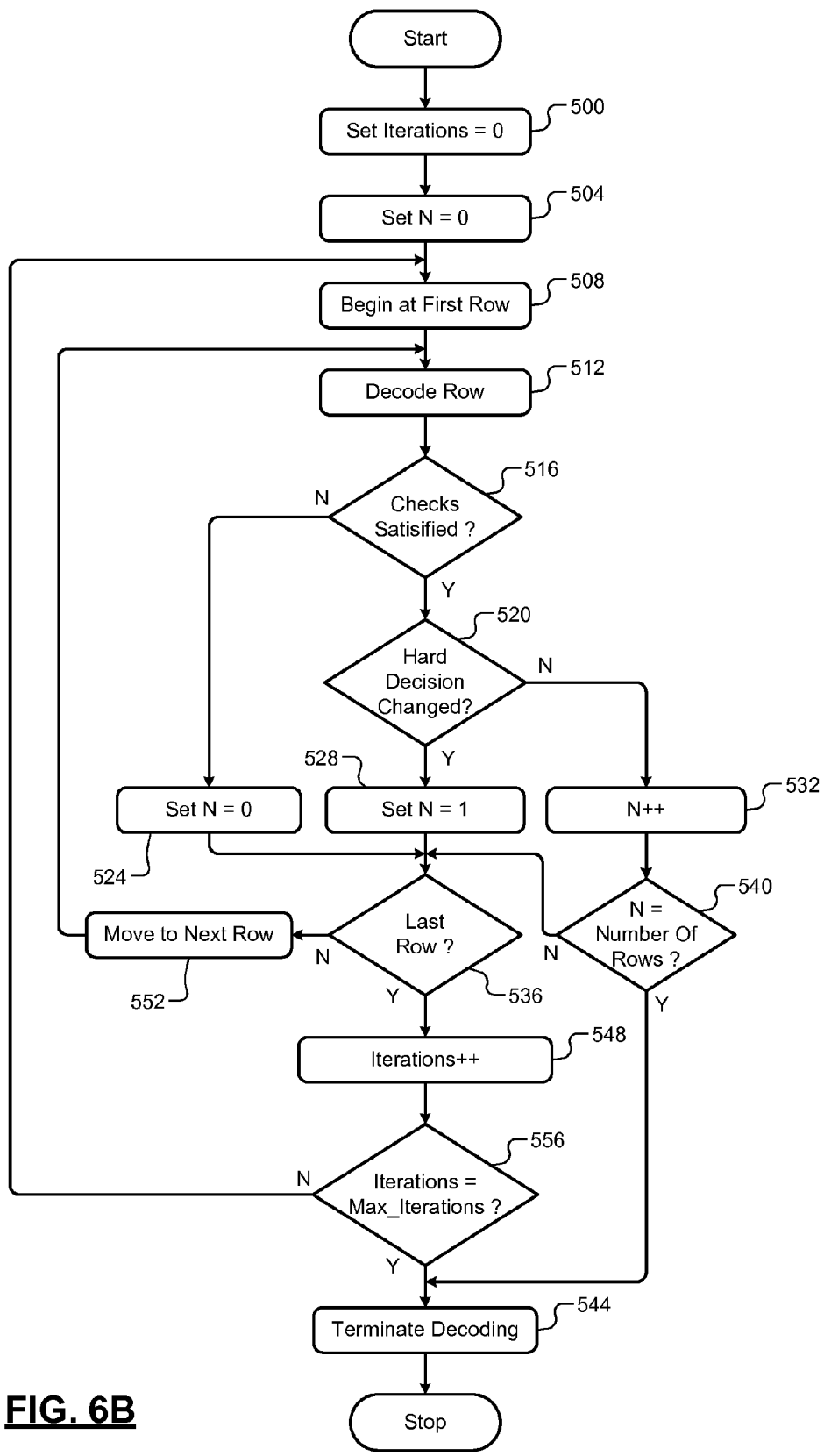

Referring now to FIG. 6B, a modification of the direction termination processing of FIG. 6A is presented. While FIG. 6A terminates processing once row checks from rows one to seven have been checked successfully and in that order, the method of FIG. 6B terminates processing once any consecutive seven of the checks have completed successfully. This may reduce processing time when compared with FIG. 6A. Control begins at 500, where an interations variable is set to zero. Control continues at 504, where at counter N is initialized to zero.

Control continues at 508, where control begins at the first row. Control continues at 512, where control performs LDPC decoding on the current row. Control continues 516, where control determines whether the current row check is satisfied. If so, control transfers to 520; otherwise, control transfers to 524. At 520, control determines whether the hard decision changed. If so, control transfers to 528; otherwise, control transfers to 532. At 524, N is set to zero because even the current row check has not passed. Therefore, none of the rows' checks can be assumed valid.

Control then continues at 536. At 528, control sets N to one because, although the current row check is satisfied, the hard decision has changed and thereby rendered previous row checks invalid. Control continues at 536. At 532, control increments N because the hard decision was not changed and the current row check was passed. Control continues at 540. After incrementing N, control checks whether N is now equal to the number of rows. If so, the row checks for each of the rows have been successful without requiring any hard decision change, and control transfers to 544. Otherwise, control transfers to 536. At 544, control terminates decoding and stops.

At 536, control determines whether the last row has been processed. If so, control transfers to 548; otherwise, control transfers to 552. At 552, control moves to the next row and returns to 512. At 548, control increments the iterations variable by one and continues at 556. At 556, control determines whether the number of iterations is now equal to the predetermined number of maximum iterations. If so, control transfers to 544 to terminate decoding; otherwise, control returns to 508 to begin another iteration.

Figure 7A:
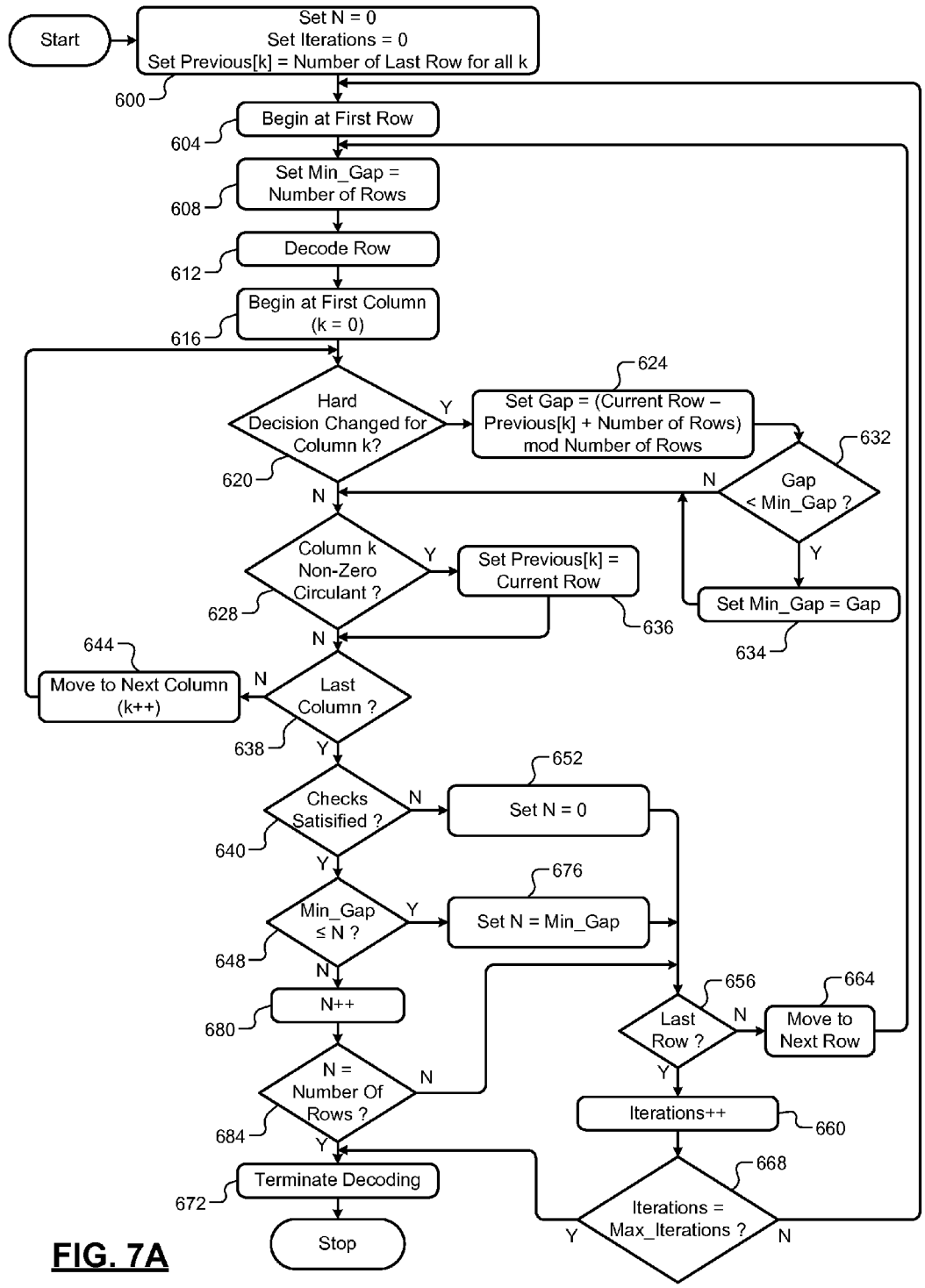
FIGS. 7A-7B are flowcharts depicting examples of operation of column gap termination.
Figure 7B:
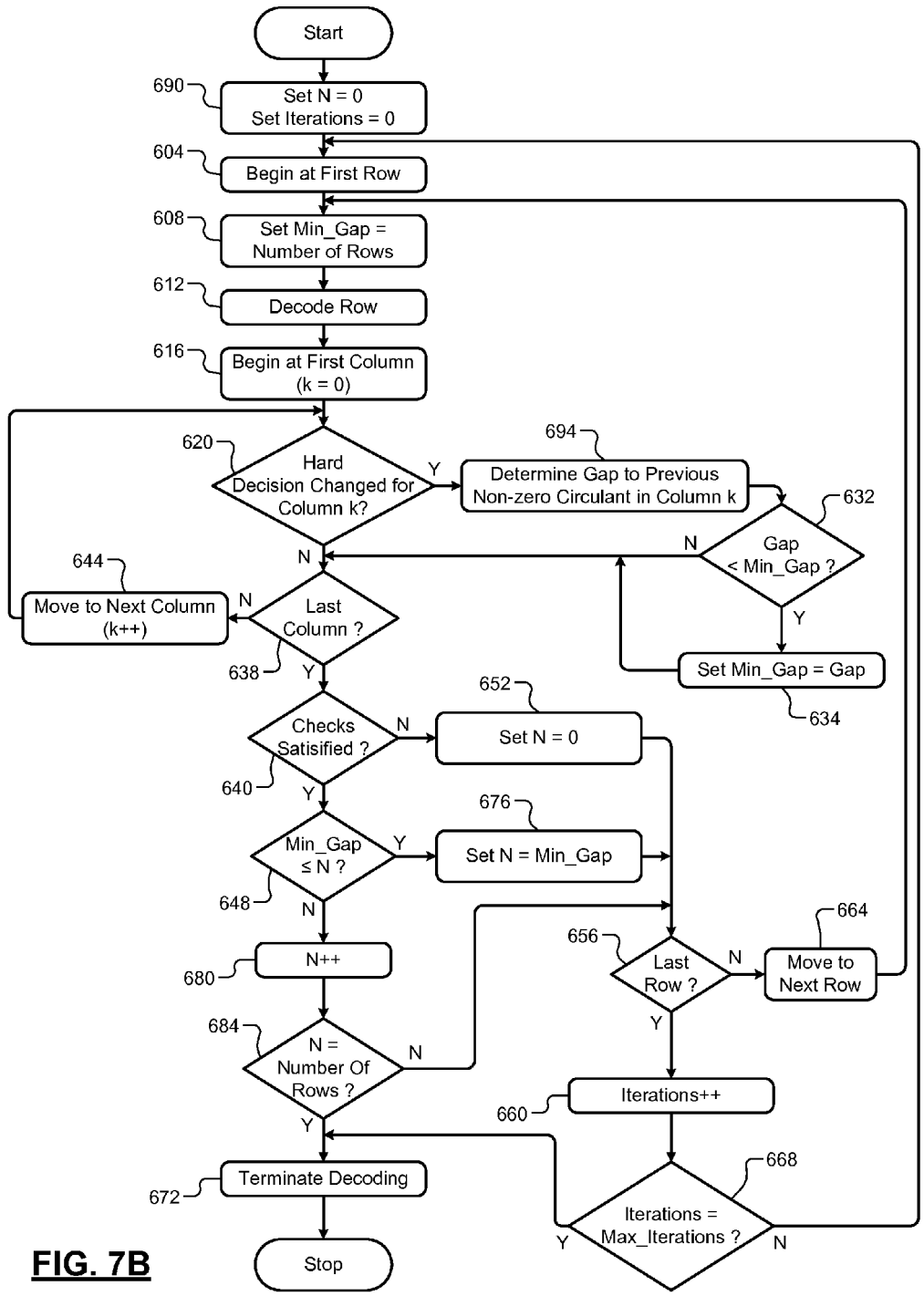

Referring now to FIGS. 7A-7B, methods of early termination according to column gaps is presented. When compared with FIGS. 6A and 6B, the methods of FIGS. 7A and/or 7B may reduce processing time because not all hard decision changes will invalidate previous row checks. The column gap method recognizes this and does not invalidate previously passed row checks when a hard decision change does not affect those passed row checks.

Referring now to FIG. 7A, control starts at 600, where a counter N is initialized to zero and an iterations variable is also initialized to zero. In addition, control initializes an array named Previous[ ] having a number of elements equal to the number of columns. Each of the elements is initialized to be equal to the number of the last row. Control continues at 604, where the first row is selected. Control continues at 608, where a minimum gap variable is initialized to the number of rows. This is the largest possible column gap, and any smaller gaps will replace this largest number in the minimum gap variable. Control continues at 612, where the present row is processed.

Control continues at 616, where the first column is selected. A column index k may be used to track the selected column and may therefore be set to zero for the first column. Alternatively, the first column could correspond to a column index of one. Control continues at 620, where control determines whether the decoding of 612 has changed the hard decision for column k. If so, control transfers to 624; otherwise, control transfers to 628.

At 624, control determines the gap from the current row to the most recent row having a non-zero circulant in column k. For example, this gap may be calculated by subtracting the previous row number from the current row number. The previous row number for column k may be obtained by indexing the Previous[ ] array with k. In some situations, the previous row actually has a higher row number. For example, referring to FIG. 5A, if column nine of the codeword has changed during the processing of row four, the previous row having a non-zero circulant in column nine is row six. Four minus six results in a value of negative-two. Negative values can be increased by the number of rows (for FIG. 5A, this would be seven). Therefore, the gap would be the sum of negative two and seven, which is five.

In various implementations, the difference of the current row and the location of the previous row (Previous[k]) may always be added to the number of rows. To prevent this number from being greater than or equal to the number of rows, the sum can be performed modulo the number of rows. The resulting expression is as follows: (Current Row−Previous[k]+Number of Rows)mod(Number of Rows).

Control continues at 632, where control determines whether the gap determined in 624 is less than the minimum gap variable. If so, control transfers to 634; otherwise, control transfers to 628. At 634, the minimum gap variable is updated to be equal to the gap determined at 624. Control then continues at 628. At 628, control determines whether column k contains a non-zero circulant for the current row. If so, control transfers to 636; otherwise, control continues at 638. At 636, control updates the Previous[ ] array for row k to be equal to the current row. In this way, the Previous[ ] matrix is maintained with the most recent previous row number. Control then continues at 638.

At 638, control determines whether the current column is the last column. If so, control transfers to 640; otherwise, control transfers to 644. At 644, control moves to the next column, which may be accomplished by incrementing the column index k by one. Control then returns to 620. At 640, control determines whether the current row check is passed, or, satisfied. If so, control transfers to 648; otherwise, control transfers to 652. At 652, control sets N equal to zero because even the current row check is not satisfied. Control then transfers to 656. At 656, control determines whether the current row is the last row. If so, control transfers to 660; otherwise, control moves to the next row at 664 and returns to 608.

At 660, control increments the iterations variable by one. Control continues at 668, where the number of iterations is compared to a predetermined maximum number of iterations. If the numbers of iterations has reached the predetermined maximum number of iterations, control transfers to 672; otherwise, control returns to 604. At 672, control terminates decoding and stops. At 648, control determines whether the minimum gap variable is less than or equal to the counter N. If so, control transfers to 676; otherwise control transfers to 680. At 676, the minimum gap to a previous row having a non-zero circulant limits the number of valid row checks. Therefore, the counter N is set equal to the minimum gap variable. Control then continues at 656. At 680, the minimum gap is great enough that no previous checks are invalidated and therefore N is incremented. Control continues at 684, where if N is now equal to the number of rows, control transfers to 672; otherwise, control transfers to 656.

Referring now to FIG. 7B, another method of column gap termination is presented. Many of the elements may be similar to those of FIG. 7A and are therefore labeled with the same reference numerals. In place of 600, FIG. 7B includes 690, where no Previous[ ] array is initialized, as the array is not used in FIG. 7B. In addition, FIG. 7B omits 628 and 636. In place of 624, FIG. 7B includes 694, where the gap to the previous non-zero circulant in column k is determined. Because no Previous[ ] array is maintained, this determination is not based on the Previous[ ] array. Instead, another approach is used. For a given parity check matrix, the column gaps for each row are known a priori. These predetermined column gaps may be stored, such as along with the parity check matrix. Additionally or alternatively, these predetermined column gaps may be retrieved from a decoding scheduling storage module, such as the decoding schedule storage module 332 of FIG. 4, during the processing of each row.

Figure 8:
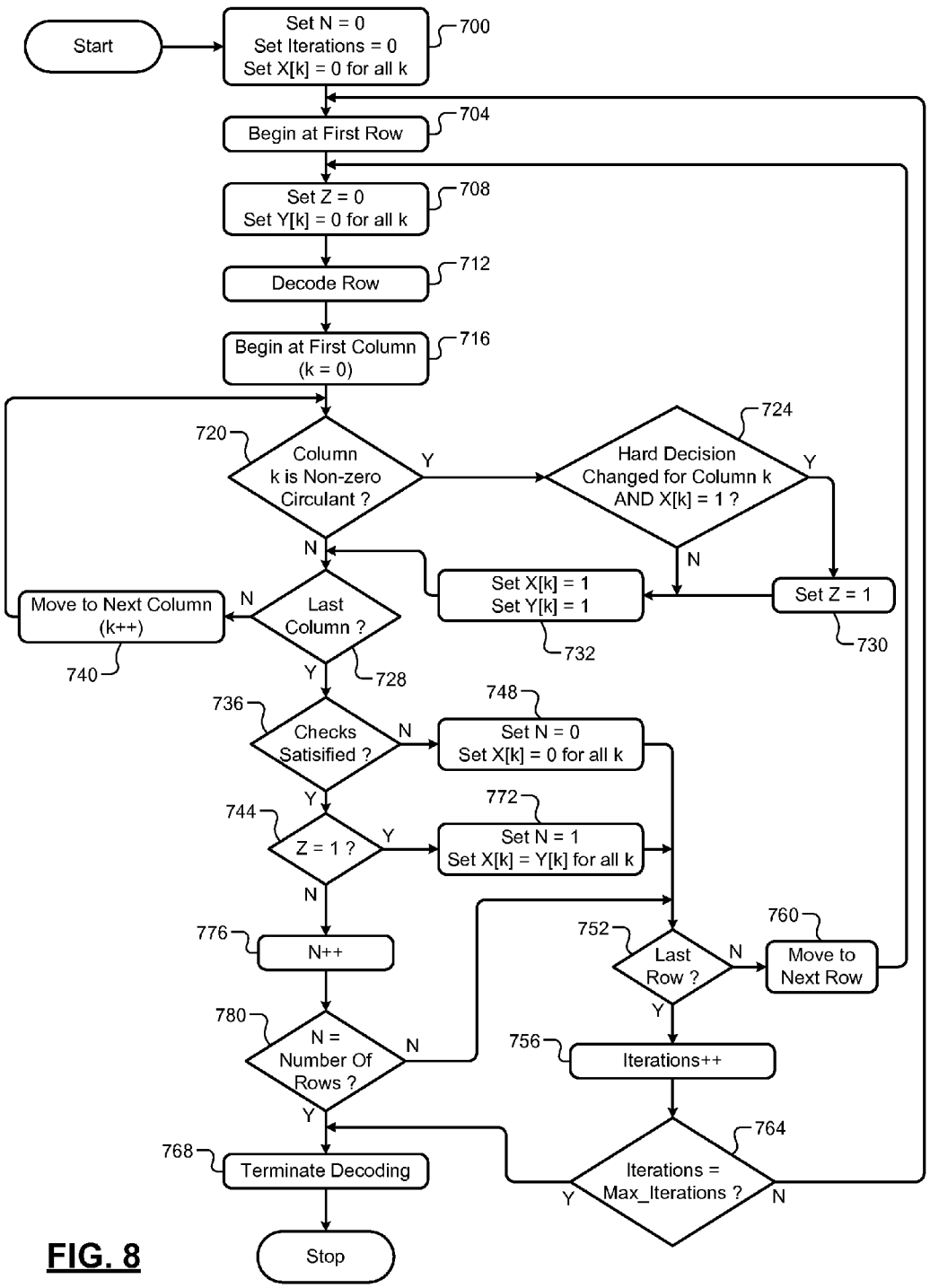
FIG. 8 is a flowchart depicting an example of operation of flag-based termination.

Referring now to FIG. 8, example operation of a flag termination method is shown. Control begins at 700, where a counter N is initialized to zero and an iterations variable is also initialized to zero. Further, a vector of flags X, including one binary value for every column of the parity check matrix, is initialized to zeroes. The method described below will cause each flag X[k] to indicate whether a non-zero circulant is present in column k for any of the previous valid row checks. The flag vector X is therefore cumulative, including a one in each location where a non-zero circulant has been present for any of the valid row checks. For example only, if a certain codeword has passed row checks for rows one, two, and three, the flag vector X will include a one in every position where a non-zero circulant is present in any of the first three rows.

Control continues at 704, where control selects the first row. Control continues at 708, where a flag Z is initialized to zero. The flag Z is an indicator that a hard decision change has collided with the non-zero circulant of a previously passed row check. The flag Z therefore indicates that at least one previously passed row check is no longer valid. At 708, control also initializes to zero each value of a temporary flag vector Y, which includes a binary value for each of the k columns. The temporary flag vector Y is zeroed at the beginning of the processing of each row and therefore only tracks the non-zero circulants of the current row. In the event that a hard decision change in the current row invalidates a previously valid row check, N is reset to one and the values of the temporary flag vector are stored into the flag vector X as a starting point.

Control continues at 712, where processing for the current row is performed. As described above, this processing may result in a hard decision change. Control continues at 716, where control selects the first column by setting a column index k to zero. Control continues at 720, where control determines whether column k of the current row is a non-zero circulant. If so, control transfers to 724; otherwise, control transfers to 728. At 724, control determines whether the hard decision was changed by 712 for the current column and whether the kth value of the flag vector X (X[k]) is equal to one. If both of these are true, control transfers to 728; otherwise, control transfers to 732.

At 728, not only has the hard decision changed for column k, but the flag vector X[k] being equal to one for the current column means that a previously valid row check is no longer valid. Therefore, the flag Z is set to one and control continues at 732. At 732, the kth value of X for the current column is set to one to reflect the non-zero circulant located in column k for the present row. Similarly, the kth value of the temporary flag vector Y is also set to one. Control then continues at 728. At 728, control determines whether the current column is the last column. If so, control transfers to 736; otherwise, control transfers to 740. At 740, control moves to the next column by incrementing the column index k, and control returns to 720.

At 736, control determines whether the current row check is satisfied. If so, control transfers to 744; otherwise, controls transfers to 748. At 748, the current row check is not being satisfied and therefore is N is reset to zero. In addition, the flag vector k is reset to zero for all values of k. Control then continues at 752. At 752, control determines whether the current row is the last row. If so, control transfers to 756; otherwise, control transfers to 760. At 760, control moves to the next row and returns to 708.

At 756, control increments the iterations variable and continues at 764. At 764, control transfers to 768 if the number of iterations is now equal to the maximum number of iterations; otherwise, control returns to 704 to perform another iteration. At 768, control terminates decoding and stops. At 744, control determines whether the flag Z has been set. If so, control transfers to 772; otherwise, control transfers to 776. At 772, the flag Z has been set and therefore all previous row checks are considered to be invalid. The counter N is therefore set to one, which corresponds to passing the current row check.

In addition, the flag vector X is initialized with the values of the temporary flag vector Y, which causes the flag vector X to reflect the locations of the non-zero circulants in the current row, for which the row check has passed. Control then continues at 752. At 776, control increments N and continues at 780. At 780, control determines whether N is equal to the number of rows and if so, control transfers to 768; otherwise, control transfers to 752.

Figure 9:
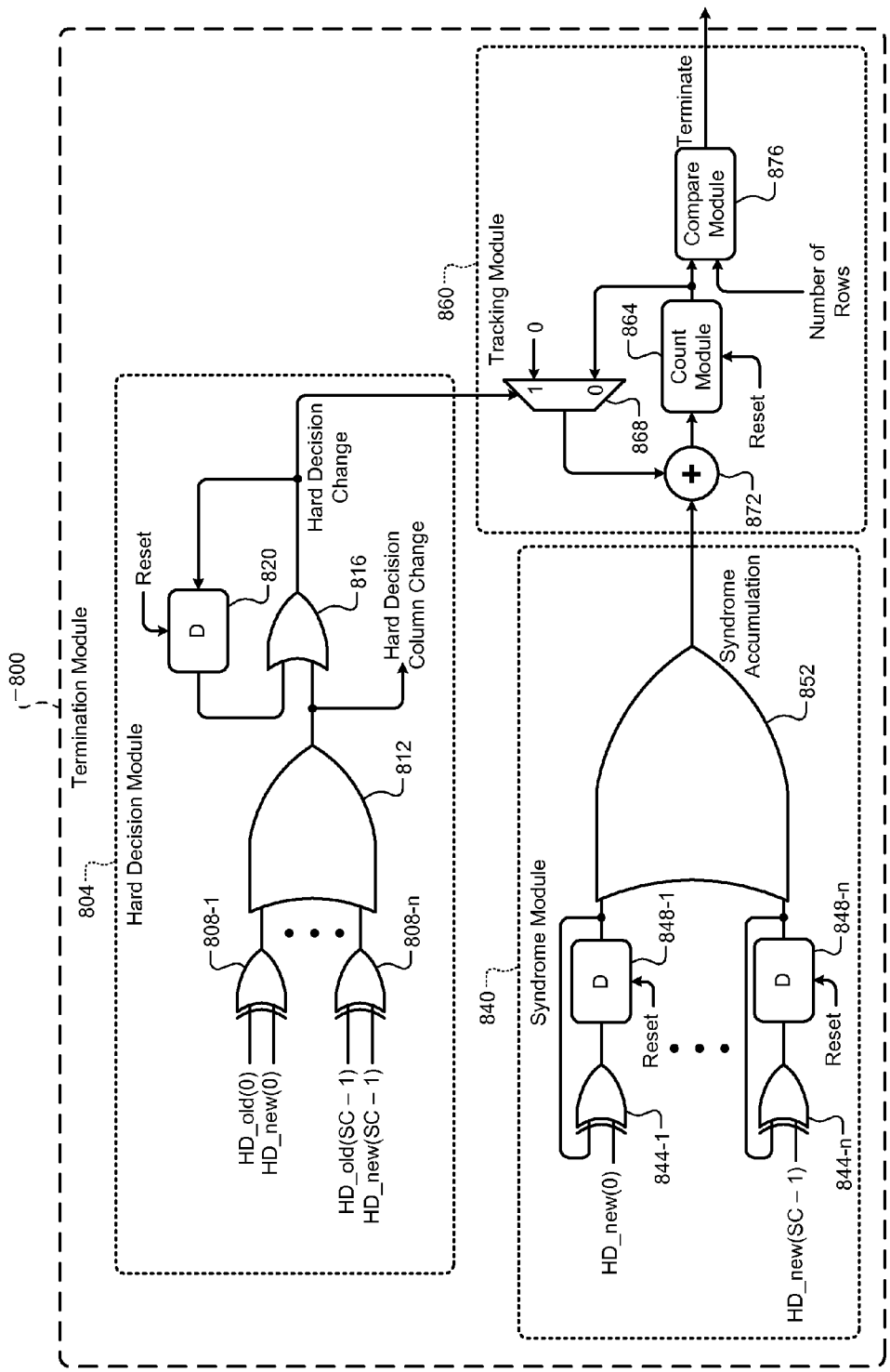
FIG. 9 is a functional block diagram of an example implementation of a termination module implementing direct termination.

Referring now to FIG. 9, an example implementation of a termination module 800 using direct termination is presented. The termination module 800 includes a hard decision module 804. The hard decision module 804 outputs a hard decision change signal indicating that the hard decision has changed for one of the columns. In addition, the hard decision module 804 may output a hard decision column change signal indicating that a specific column's hard decision has changed.

The hard decision module 804 includes exclusive-or (XOR) gates 808-1 ... 808-$n$ (collectively, XOR gates 808). The number of the XOR gates 808 is equal to the number of symbols in one section of the hard decision. Each section of the hard decision corresponds to one circulant of the parity check matrix and therefore the number N is equal to the size of the circulant, SC. The XOR gate 808-1 receives a least significant bit of the previous hard decision and the least significant bit of the new hard decision. Being an XOR gate, an output of the XOR gate 808-1 is one when the input values differ. The remaining XOR gates 808 receive additional bits of the old and new hard decisions.

An OR gate 812 receives the outputs of the XOR gates 808. Therefore, an output of the OR gate 812 is high if any of the symbols of the new hard decision differ from the old hard decision. The output of the OR gate 812 is referred to as the hard decision column change signal. An OR gate 816 receives the output of the OR gate 812 and also receives an output from a flip-flop 820. The flip-flop 820 may be a single bit binary flip-flop that records whether any of the hard decision column change signals have been high. This is accomplished by resetting the flip-flop 820 to a low level at the beginning of each layer.

Because the output of the flip-flop 820 is provided to the OR gate 816, the output of the OR gate 816 is high when the current hard decision column change signal is high or when any previous hard decision column change signal for the present layer has been high. The output of the OR gate 816 is referred to as the hard decision change signal.

The termination module 800 also includes a syndrome module 840. The syndrome module 840 includes XOR gates 844-1 ... 844-$n$ (collectively, XOR gates 844) and flip-flops 848-1 ... 848-$n$ (flip-flops 848). The XOR gate 844-1 receives the least significant bit of the new hard decision as well as an output of a flip-flop 848-1. Similarly, the XOR gate 844-$n$ receives the most significant bit of the new hard decision as well as an output of the flip-flop 848-$n$. The flip-flops 848 are reset to zero at the beginning of the layer. The outputs of the flip-flops 848 are provided to an OR gate 852.

An output of the OR gate 852 is referred to as a syndrome accumulation signal. At the end of processing the layer, the syndrome accumulation signal may be an indicator of whether the current hard decision satisfies the check equations of the current layer. Even though the syndrome accumulation signal may not be the same as the actual syndrome, the syndrome accumulation signal may be sufficient for verifying the check equations of the current layer.

A tracking module 860 implements direct termination, which may function similarly to FIG. 6B. A count module 864 tracks the number of rows for which row checks have been performed on the current syndrome. The count module 864 may therefore be reset to zero at the beginning of decoding a codeword. An output of the count module 864 is provided to a multiplexer 868. The multiplexer 868 may also receive a constant value of zero.

The hard decision change signal from the hard decision module 804 may control the multiplexer 868. When the hard decision change signal is high, the multiplexer 868 outputs a zero; when the hard decision change signal is low, the multiplexer 868 outputs the output of the count module 864. A summing module 872 adds the output of the syndrome module 840 to the output of the multiplexer 868. In various implementations, the syndrome accumulation signal may be either zero or one. Therefore, when the current rows' checks indicate that the codeword is valid, the syndrome accumulation signal is one and the output of the multiplexer 868 is thereby incremented and stored by the count module 864.

The value stored by the count module 864 is incremented when the hard decision change signal indicates that the hard decision has not changed for the current row. Otherwise, the value of zero causes the count module 864 to be reset. The output of the count module 864 is provided to a compare module, which outputs a terminate signal when the output of the count module is equal to the number of rows.

Figure 10A:
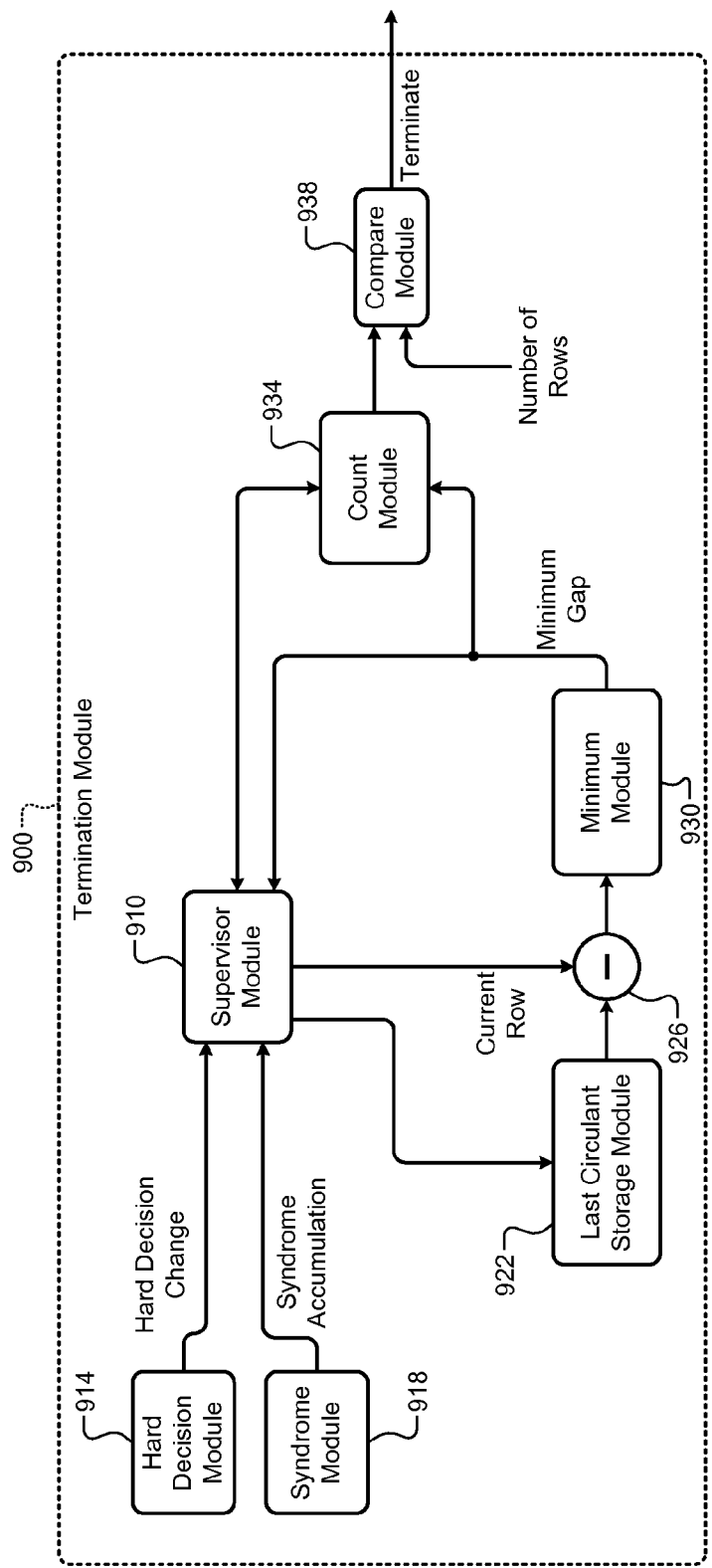
FIGS. 10A-10B are functional block diagrams of example implementations of termination modules implementing column gap termination.

Referring now to FIG. 10A, a termination module 900 implements column gap termination. The termination module includes a supervisor module 910 that receives a hard decision change signal from a hard decision module 914, which may be implemented similarly to the hard decision module 804 of FIG. 9. The supervisor module 910 also receives a syndrome accumulation signal from a syndrome module 918, which may be implemented similarly to the syndrome module 840 of FIG. 9.

The termination module 900 includes a last circulant storage module 922 which tracks, for each column, the row number of the last non-zero circulant. The supervisor module 910 updates the values in the last circulant storage module 922 during LDPC processing. When LDPC processing is initiated, the supervisor module 910 may initialize each entry of the last circulant storage module 922 to be equal to the last row of the parity check matrix. As processing proceeds, the supervisor module 910 updates the last circulant storage module 922 as non-zero circulants are encountered.

A subtraction module 926 subtracts the number of the current row from each of the row numbers of the last circulant storage module 922 and provides the results to a minimum module 930. In various implementations, the subtraction module 926 may account for negative differences by adding the number of rows to any negative number. Alternatively, the number of rows can be added to each difference and a modulo operation based on the number of rows can be performed. The minimum module 930 identifies differences for columns that have a non-zero circulant ion the current row and then selects the smallest of the differences. The minimum module 930 outputs the selected difference as a minimum gap.

The minimum gap is received by the supervisor module 910 and a count module 934. The count module 934 stores the number of rows for which the current codeword has been checked. When the minimum gap is less than the count stored by the count module 934, the supervisor module 910 may instruct the count module 934 to set the count to the minimum gap. A compare module 938 outputs a terminate signal when the count of the count module 934 is equal to the number of rows of the parity check matrix.

Figure 10B:
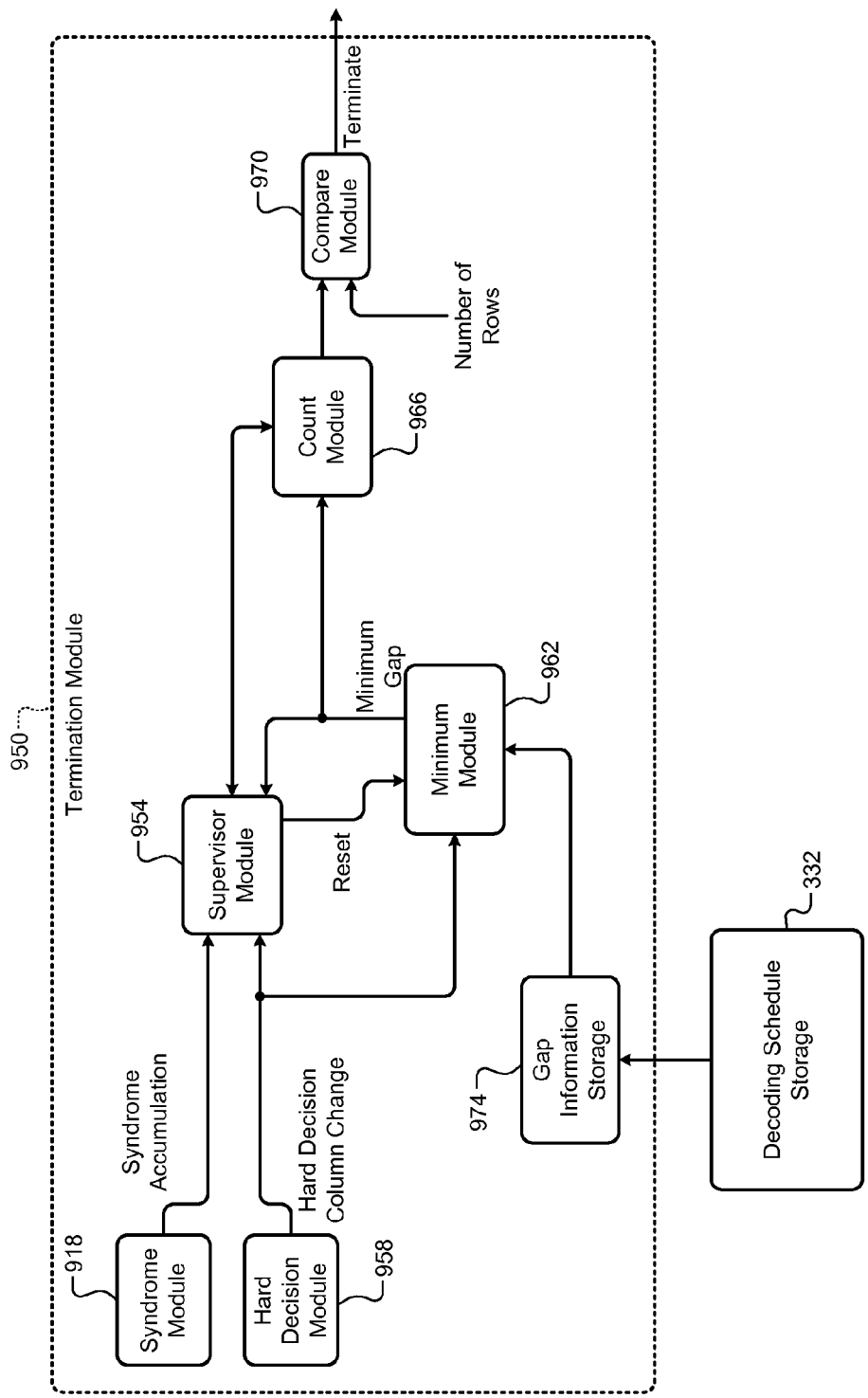

Referring now to FIG. 10B, a termination module 950 implementing a variation on column gap termination is presented. A supervisor module 954 receives the syndrome accumulation signal from the syndrome module 918. The supervisor module 954 also receives a hard decision column change signal from a hard decision module 958, which may be implemented similarly to the hard decision module 804 of FIG. 9. A minimum module 962 may also receive the hard decision column change signal.

A count module 966 may operate similarly to the count module 934 of FIG. 10A. A compare module 970 may operate similarly to the compare module 938 of FIG. 10A. The decoding schedule storage module 332 of FIG. 4 is shown. In the implementation of FIG. 10B, gap information is stored in the decoding schedule storage module 332. This information is provided to gap information storage module 974 of the termination module 950 during LDPC processing. For example only, the gap information storage module 974 may be read for each row of the check matrix and may include a value for each column specifying a gap to the most recent row having a non-zero circulant. In various implementations, the gap information storage module 974 may receive only column gap information for columns for which the current row has a non-zero circulant.

The minimum module 962 reads the gap for each column from the gap information storage module 974, and if the hard decision column change signal indicates that the hard decision has changed for this column, the minimum module 962 updates the minimum gap with the gap information. At the beginning of processing of each row, the minimum gap of the minimum module 962 may be reset by the supervisor module 954 to an initial high value. When the gap corresponding to a hard decision column change is less than the minimum gap, the minimum module 962 sets the minimum gap to be this new lower gap number.

Figure 11:
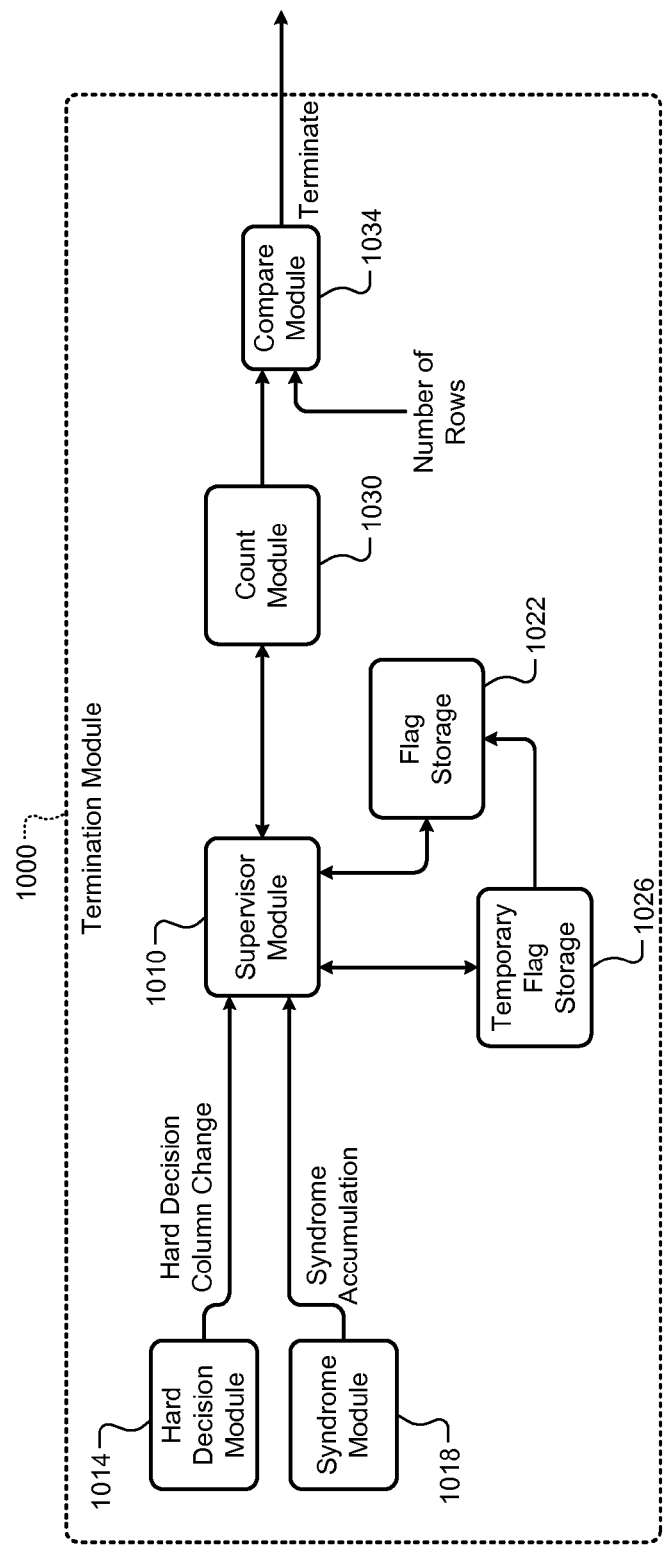
FIG. 11 is a functional block diagram of an example implementation of a termination module implementing flag-based termination.

Referring now to FIG. 11, a termination module 1000 implements flag-based termination. A supervisor module 1010 receives a hard decision column change signal from a hard decision module 1014, which may be implemented similarly to the hard decision module 804 of FIG. 9. The supervisor module 1010 also receives a syndrome accumulation signal from a syndrome module 1018, which may be implemented similarly to the syndrome module 840 of FIG. 9.

A flag storage module 1022 stores a flag for each column, the flag indicating that the corresponding column includes a non-zero circulant for one of the rows whose checks a current codeword has passed. A temporary flag storage module 1026 stores a flag for each column, the flag indicating whether, for the current row, the column includes a non-zero circulant. When previous row checks are invalidated because a hard decision column change has been made to a column where a previously passed check includes a non-zero circulant, the flag storage module 1022 is reset based on the current row information stored in the temporary flag storage module 1026.

The supervisor module 1010 updates a count module 1030 with a number of rows whose tests have been passed by the current codeword. This count is reset to zero if the codeword does not pass the current row check. The count is reset to one if the hard decision has been changed for a column for which a previously valid check includes a non-zero circulant. In other words, if a hard decision change could cause one of the previous row checks to indicate that the new codeword is invalid, the previous row checks can no longer be assumed to be valid. A compare module 1034 may operate similarly to the compare module 876 of FIG. 9.

Figure 12:
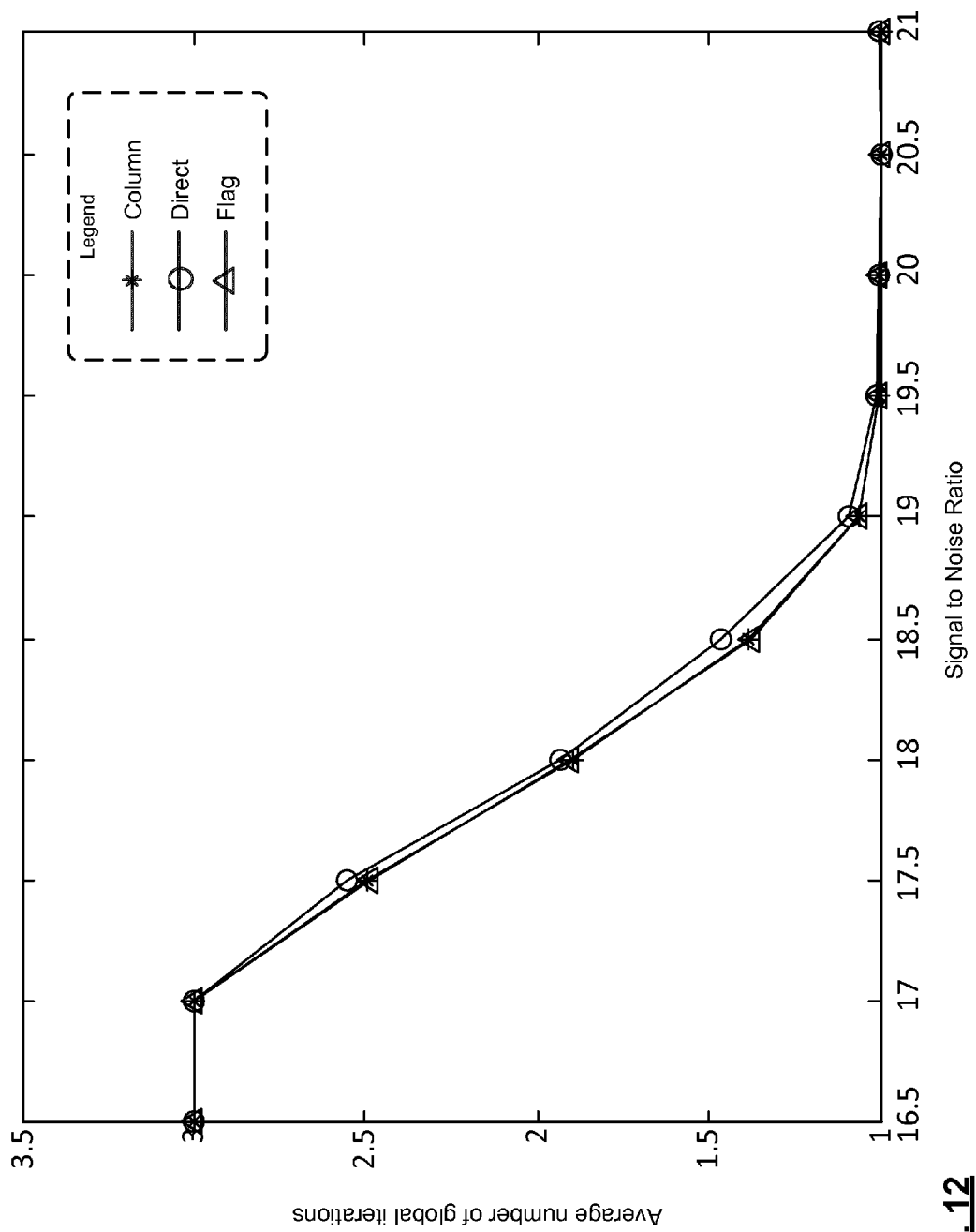
FIG. 12 is a plot of average number of global iterations with respect to signal to noise ratio (SNR)

Referring now FIG. 12, a plot of average number of global iterations with respect to signal to noise ratio (SNR) is shown. Direct termination, such as is described in FIGS. 6A and 6B, is depicted with circles. Column gap termination, such as is described in FIGS. 7A and 7B, is depicted with asterisks. Flag-based termination, such as is described in FIG. 8, is shown with triangles. As the SNR improves, the number of global iterations performed decreases. While column-based termination represents an improvement (fewer number of global iterations) than direct termination, flag-based termination matches the performance of column gap termination.

Flag-based termination may require less storage (two sets of binary flags) than column gap termination (a set of previous row numbers). Flag-based termination may therefore require 2*(Number of Rows) bits of storage. Meanwhile, each element of a previous row number matrix may require $\log_2$(Number of Rows) bits. Therefore, column gap termination may require $\log_2$(Number of Rows)*(Number of Rows) bits. When (Number of Rows) is greater than 4, the number of bits of storage for column gap termination is greater than the number of bits for flag-based termination.

Figure 13:
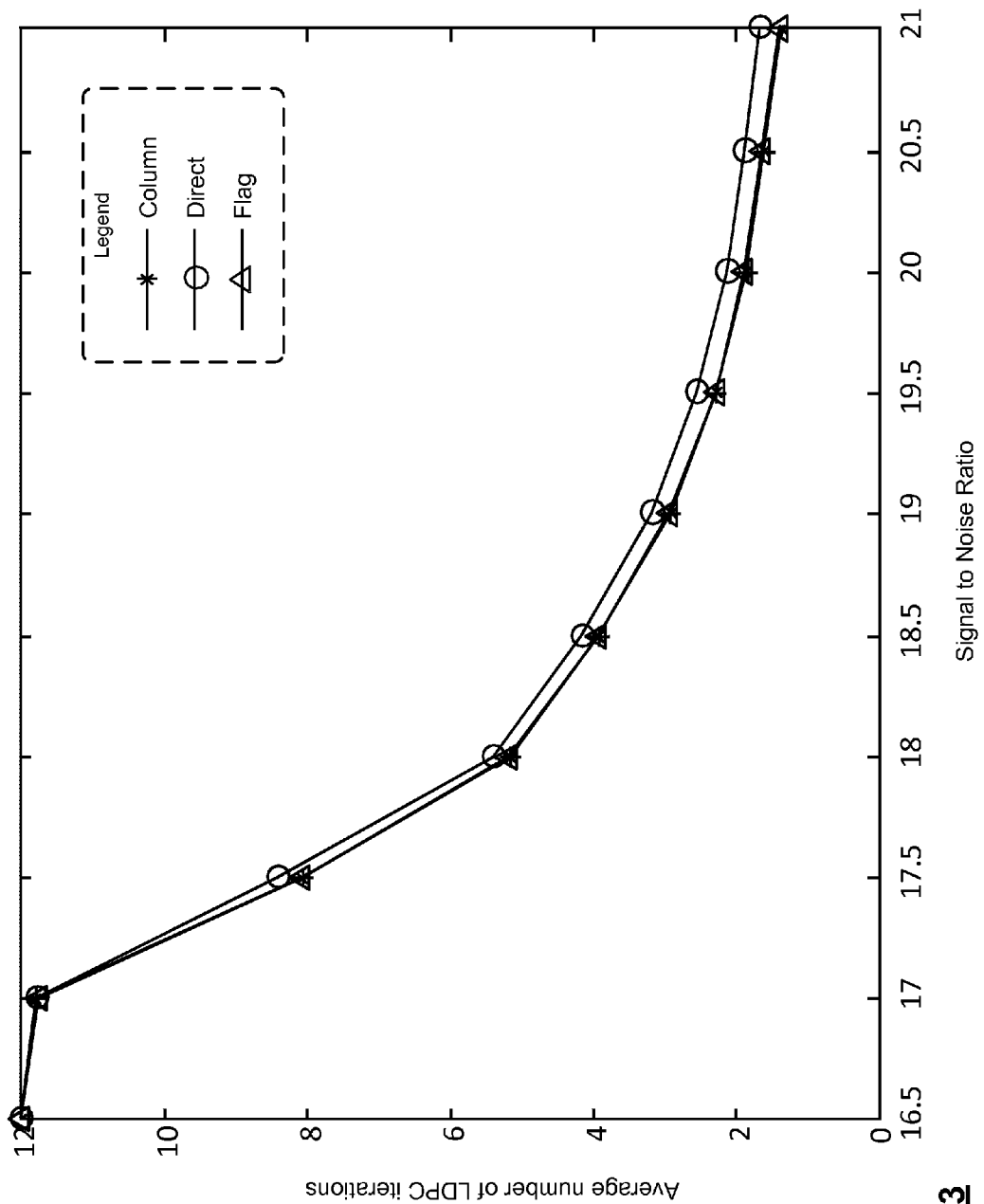
FIG. 13 is a plot of average number of LDPC iterations with respect to SNR.

Referring now to FIG. 13, a plot of average number of LDPC iterations with respect to SNR is shown. Similar to FIG. 12, improvements in SNR allow fewer LDPC iterations to be performed. Flag-based and column gap termination appear to have similar performance improvements over direct termination. Meanwhile, without early termination, the number of LDPC iterations would need to be set to at least 12 in order to allow for correct decoding of codewords down to an SNR of 16.5.

The performance gains (in terms of fewer average number of LDPC iterations) of early termination are not very significant when the SNR remains at 16.5 dB or 17 dB. However, when the SNR improves to even 17.5 dB, the improvements are substantial, at approximately 30%. At an SNR of 21 dB, the number of iterations performed without early termination would still be 12, even though as shown in FIG. 13, fewer than two are necessary on average when early termination is used. Therefore, the improvement afforded by early termination increases with SNR, and can be significant, in this case allowing nearly an 80 percent reduction in average number of LDPC iterations for certain values of SNR.

Figure 14:
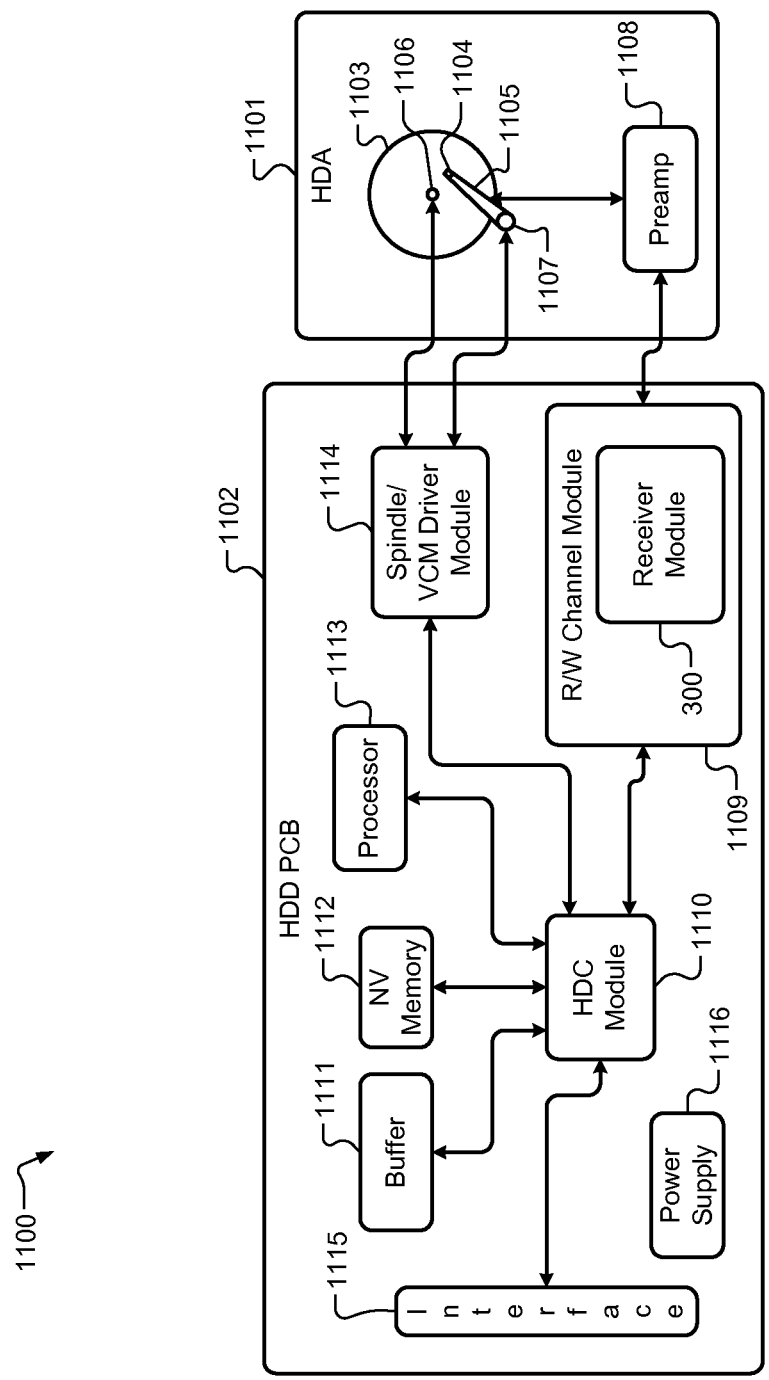
FIG. 14 is a functional block diagram of a hard disk drive.

Referring now to FIG. 14, the teachings of the disclosure can be implemented in a read/write channel module (hereinafter, "read channel") 1109 of a hard disk drive (HDD) 1100. The HDD 1100 includes a hard disk assembly (HDA) 1101 and an HDD printed circuit board (PCB) 1102. The HDA 1101 may include a magnetic medium 1103, such as one or more platters that store data, and a read/write device 1104. The read/write device 1104 may be arranged on an actuator arm 1105 and may read and write data on the magnetic medium 1103. Additionally, the HDA 1101 includes a spindle motor 1106 that rotates the magnetic medium 1103 and a voice-coil motor (VCM) 1107 that actuates the actuator arm 1105. A preamplifier device 1108 amplifies signals generated by the read/write device 1104 during read operations and provides signals to the read/write device 1104 during write operations.

The HDD PCB 1102 includes the read channel 1109, a hard disk controller (HDC) module 1110, a buffer 1111, nonvolatile memory 1112, a processor 1113, and a spindle/VCM driver module 1114. The read channel 1109 processes data received from and transmitted to the preamplifier device 1108. The HDC module 1110 controls components of the HDA 1101 and communicates with an external device (not shown) via an I/O interface 1115. The external device may include a computer, a multimedia device, a mobile computing device, etc. The I/O interface 1115 may include wireline and/or wireless communication links.

The HDC module 1110 may receive data from the HDA 1101, the read channel 1109, the buffer 1111, nonvolatile memory 1112, the processor 1113, the spindle/VCM driver module 1114, and/or the I/O interface 1115. The processor 1113 may process the data, including encoding, decoding, filtering, and/or formatting. The processed data may be output to the HDA 1101, the read channel 1109, the buffer 1111, nonvolatile memory 1112, the processor 1113, the spindle/VCM driver module 1114, and/or the I/O interface 1115.

The HDC module 1110 may use the buffer 1111 and/or nonvolatile memory 1112 to store data related to the control and operation of the HDD 1100. The buffer 1111 may include DRAM, SDRAM, etc. Nonvolatile memory 1112 may include any suitable type of semiconductor or solid-state memory, such as flash memory (including NAND and NOR flash memory), phase change memory, magnetic RAM, and multi-state memory, in which each memory cell has more than two states. The spindle/VCM driver module 1114 controls the spindle motor 1106 and the VCM 1107. The HDD PCB 1102 includes a power supply 1116 that provides power to the components of the HDD 1100.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A method comprising:
   receiving a codeword over a communications channel;
   initializing a test codeword to be equal to the codeword received over the communications channel;
   performing, for each row of a low-density parity check (LDPC) matrix, an LDPC processing operation on the test codeword;
   once the LDPC processing operations have been performed for all of the rows of the LDPC matrix, repeating the LDPC processing operations;
   monitoring progress of the LDPC processing operations;
   selectively generating a termination signal in response to the test codeword being a valid codeword according to the LDPC matrix; and
   terminating the LDPC processing operations in response to generation of the termination signal.

2. The method of claim 1, wherein each of the rows of the LDPC matrix includes a plurality of sub-matrices, and wherein each column of the LDPC matrix includes a respective one of the sub-matrices from each of the rows of the LDPC matrix.

3. The method of claim 2, wherein each of the plurality of sub-matrices is a circulant matrix.

4. The method of claim 3, wherein a subset of the plurality of sub-matrices contain only zero values.

5. The method of claim 2, further comprising:
   storing a flag for each column of the LDPC matrix; and
   in response to determining that the test codeword satisfies a selected row of the rows of the LDPC matrix, setting the flag for each column whose corresponding sub-matrix in the selected row is nonzero.

6. The method of claim 5, wherein the test codeword satisfies the selected row when a product of the test codeword and the selected row is equal to zero, wherein one of the test codeword and the selected row is transposed when calculating the product.

7. The method of claim 5, wherein the determining whether the test codeword satisfies the selected row is performed upon completing the LDPC processing operation on the test codeword for the selected row.

8. The method of claim 7, further comprising:
   tracking a count of how many of the rows of the LDPC matrix have been satisfied; and
   generating the termination signal when the count is equal to a total number of the rows of the LDPC matrix.

9. The method of claim 8, wherein a first section of the test codeword corresponds to a first column of the columns of the LDPC matrix, and wherein the method further comprises resetting the count in response to (i) the LDPC processing operation having changed the first section of the test codeword while (ii) the flag for the first column is set.

10. The method of claim 9, wherein the count is reset to one when the test codeword satisfies the selected row.

11. The method of claim 10 further comprising, in response to resetting the count to one, clearing the flags and setting only the flags corresponding to nonzero sub-matrices of the selected row.

12. The method of claim 10, wherein the count is reset to zero when the test codeword does not satisfy the selected row.

13. The method of claim 12 further comprising, in response to resetting the count to zero, clearing the flags.

14. The method of claim 9, further comprising incrementing the count in response to the test codeword satisfying the selected row upon completion of the LDPC processing operation for the selected row.

15. The method of claim 1, further comprising determining, after the LDPC processing operation of a selected row of the rows of the LDPC matrix, whether the test codeword satisfies the selected row.

16. The method of claim 1, further comprising, unless the termination signal is generated, repeating the LDPC processing operations a predetermined number of times.

* * * * *